(12) United States Patent
Kiuchi

(10) Patent No.: US 8,289,500 B2
(45) Date of Patent: Oct. 16, 2012

(54) EXPOSURE APPARATUS, EXPOSURE METHOD, AND DEVICE MANUFACTURING METHOD

(75) Inventor: Tohru Kiuchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 588 days.

(21) Appl. No.: 12/382,987

(22) Filed: Mar. 27, 2009

(65) Prior Publication Data

US 2009/0208885 A1 Aug. 20, 2009

Related U.S. Application Data

(63) Continuation of application No. PCT/JP2007/069512, filed on Sep. 28, 2007.

(30) Foreign Application Priority Data

Sep. 29, 2006 (JP) ................................. 2006-267323

(51) Int. Cl.
G03B 27/52 (2006.01)

(52) U.S. Cl. ................. 355/77; 355/50; 355/53; 355/72

(58) Field of Classification Search .................... 355/72, 355/50, 53, 77
See application file for complete search history.

(56) References Cited

U.S. PATENT DOCUMENTS

| | | | |
|---|---|---|---|
| 5,969,441 A * | 10/1999 | Loopstra et al. | 310/12.06 |
| 6,262,796 B1 * | 7/2001 | Loopstra et al. | 355/53 |
| 6,611,316 B2 | 8/2003 | Sewell | |
| 6,778,257 B2 | 8/2004 | Bleeker et al. | |
| 6,897,963 B1 * | 5/2005 | Taniguchi et al. | 356/500 |
| 7,098,991 B2 * | 8/2006 | Nagasaka et al. | 355/53 |
| 7,310,132 B2 * | 12/2007 | Van Der Schoot et al. | 355/72 |
| 7,589,822 B2 * | 9/2009 | Shibazaki | 355/72 |
| 7,872,730 B2 * | 1/2011 | Kiuchi | 355/53 |
| 2002/0026878 A1 | 3/2002 | Kwan et al. | |
| 2002/0196421 A1 | 12/2002 | Tanaka et al. | |
| 2005/0117134 A1 * | 6/2005 | Nagasaka et al. | 355/30 |
| 2006/0023186 A1 | 2/2006 | Binnard | |
| 2006/0227308 A1 * | 10/2006 | Brink et al. | 355/53 |
| 2007/0127006 A1 | 6/2007 | Shibazaki | |

(Continued)

FOREIGN PATENT DOCUMENTS

EP 0 951 054 A1 10/1999

(Continued)

OTHER PUBLICATIONS

Mar. 5, 2008 International Search Report in International Patent Application No. PCT/JP2007/069512.

(Continued)

Primary Examiner — Thomas R Artman
(74) Attorney, Agent, or Firm — Oliff & Berridge, PLC

(57) ABSTRACT

An exposure apparatus includes a first optical member from which an exposure beam is emitted; a first object movable at a light-exit side of the first optical member; a second object movable, independently of the first object, at the light-exit side of the first optical member; and a driving unit that moves the first object and the second object in a first direction within a predetermined plane including a first position opposing the first optical member in a state in which the first object and the second object are close to or in contact with each other and in which positions of the first object and the second object in a second direction within the predetermined plane are shifted.

16 Claims, 19 Drawing Sheets

U.S. PATENT DOCUMENTS

2008/0111978 A1   5/2008   Shibuta

FOREIGN PATENT DOCUMENTS

| | | |
|---|---|---|
| EP | 1 037 117 A2 | 9/2000 |
| EP | 1 420 298 A2 | 5/2004 |
| EP | 1 420 299 A2 | 5/2004 |
| EP | 1 598 855 A1 | 11/2005 |
| EP | 1 710 629 A2 | 10/2006 |
| EP | 1 713 113 A1 | 10/2006 |
| EP | 1 806 772 A1 | 7/2007 |
| EP | 1 811 526 A1 | 7/2007 |
| JP | A-10-163099 | 6/1998 |
| JP | A-10-214783 | 8/1998 |
| JP | A-11-135400 | 5/1999 |
| JP | A-2000-505958 | 5/2000 |
| JP | A-2000-164504 | 6/2000 |
| JP | A-2000-511704 | 9/2000 |
| JP | A-2000-323404 | 11/2000 |
| JP | A-2001-513267 | 8/2001 |
| JP | A-2002-158168 | 5/2002 |
| JP | A-2003-17404 | 1/2003 |
| JP | A-2004-519850 | 7/2004 |
| JP | A-2004-289126 | 10/2004 |
| JP | A-2004-289128 | 10/2004 |
| JP | A-2005-32812 | 2/2005 |
| WO | WO 98/28665 A1 | 7/1998 |
| WO | WO 99/32940 A1 | 7/1999 |
| WO | WO 01/35168 A1 | 5/2001 |
| WO | WO 02/069049 A2 | 9/2002 |
| WO | WO 2004/019128 A2 | 3/2004 |
| WO | WO 2004/086468 A1 | 10/2004 |
| WO | WO 2005/024517 A2 | 3/2005 |
| WO | WO 2005/059617 A2 | 6/2005 |
| WO | WO 2005/059618 A2 | 6/2005 |
| WO | WO 2005/074014 A1 | 8/2005 |
| WO | WO 2006/009254 A1 | 1/2006 |
| WO | WO 2006/041100 A1 | 4/2006 |

OTHER PUBLICATIONS

Mar. 5, 2008 Written Opinion in International Patent Application No. PCT/JP2007/069512.

* cited by examiner ated to Japanese Patent Application No. 2006-
EXPOSURE APPARATUS, EXPOSURE METHOD, AND DEVICE MANUFACTURING METHOD

CROSS-REFERENCE TO RELATED APPLICATION

This is a Continuation Application of International Application No. PCT/JP2007/069512, filed Sep. 28, 2007, which claims priority to Japanese Patent Application No. 2006-267323, filed Sep. 29, 2006. The contents of the aforementioned applications are incorporated herein by reference.

BACKGROUND

1. Field of the Invention

The present invention relates to an exposure apparatus and an exposure method for exposing a substrate and a device manufacturing method.

2. Description of Related Art

In exposure apparatuses used in photolithography processes, multi-stage (twin-stage) exposure apparatuses provided with a plurality of (two) substrate stages for holding substrates are known as described in for example Published Japanese Translation No. 2000-511704 of the PCT International Publication, Japanese Patent Application, Publication No. 2000-323404, Published Japanese Translation No. 2001-513267 of the PCT International Publication, Japanese Patent Application, Publication No. 2002-158168, PCT International Publication No. WO 2005/074014.

In exposure apparatuses, an increase in throughput (the number of substrates that are processed per unit of time) is demanded. A multi-stage exposure apparatus performs the operation of sequentially positioning a plurality of substrate stages at an exposure station. In order to increase the throughput of the multi-stage exposure apparatus, it is preferable to minimize the period of time, for example, from after exposure of the substrate held on a first substrate stage is completed until exposure of the substrate held on a second substrate stage is started.

A purpose of some aspects of the present invention is to provide an exposure apparatus, an exposure method, and a device manufacturing method where the throughput can be increased.

SUMMARY

According to a first aspect of the present invention, an exposure apparatus that exposes a substrate with an exposure beam is provided. The exposure apparatus includes: a first optical member from which the exposure beam is emitted; a first object movable at a light-exit side of the first optical member; a second object movable, independently of the first object, at the light-exit side of the first optical member; and a driving unit that moves the first object and the second object in a first direction within a predetermined plane including a first position opposing the first optical member in a state in which the first object and the second object are close to or in contact with each other and in which positions of the first object and the second object in a second direction within the predetermined plane are shifted.

According to the first aspect of the present invention, the throughput can be increased.

According to a second aspect of the present invention, a device manufacturing method comprising: exposing a substrate by use of the exposure apparatus according to the above-described aspect; and developing the exposed substrate is provided.

According to the second aspect of the present invention, a device can be manufactured using an exposure apparatus with increased throughput.

According to a third aspect of the present invention, an exposure method for exposing a substrate with an exposure beam is provided. The method includes: making a first object and a second object, which are movable at a light-exit side of a first optical member from which the exposure beam is emitted, close to or contact with each other in a first direction within a predetermined plane including a first position opposing the first optical member; moving the first object and the second object in the first direction in a state in which the first object and the second object are close to or in contact with each other and in which positions of the first object and the second object in a second direction within the predetermined plane are shifted.

According to the third aspect of the present invention, the throughput can be increased.

According to a fourth aspect of the present invention, a device manufacturing method comprising: exposing a substrate by use of the exposure method according to the above-described aspect; and developing the exposed substrate is provided.

According to the fourth aspect of the present invention, a device can be manufactured based on an exposure method where the throughput can be increased.

According to the some aspects of the present invention, the throughput can be increased, and therefore, the productivity of the device can be increased.

DESCRIPTION OF EMBODIMENTS

Hereunder is a description of embodiments of the present invention with reference to the drawings. However the present invention is not limited to this description. In the following explanation, an XYZ orthogonal coordinate system is set to explain the positional relationship of each member with reference to this XYZ orthogonal coordinate system. A predetermined direction in the horizontal plane is defined as an X axial direction, a direction orthogonal to the X axial direction in the horizontal plane is defined as a Y axial direction, and a direction orthogonal to both the X axial direction and the Y axial direction, that is, the vertical direction is defined as a Z axial direction. Furthermore, the rotational (tilting) directions about the X axis, the Y axis, and the Z axis are defined as a θX direction, a θY direction, and a θZ direction, respectively.

<First Embodiment>

Figure 1:
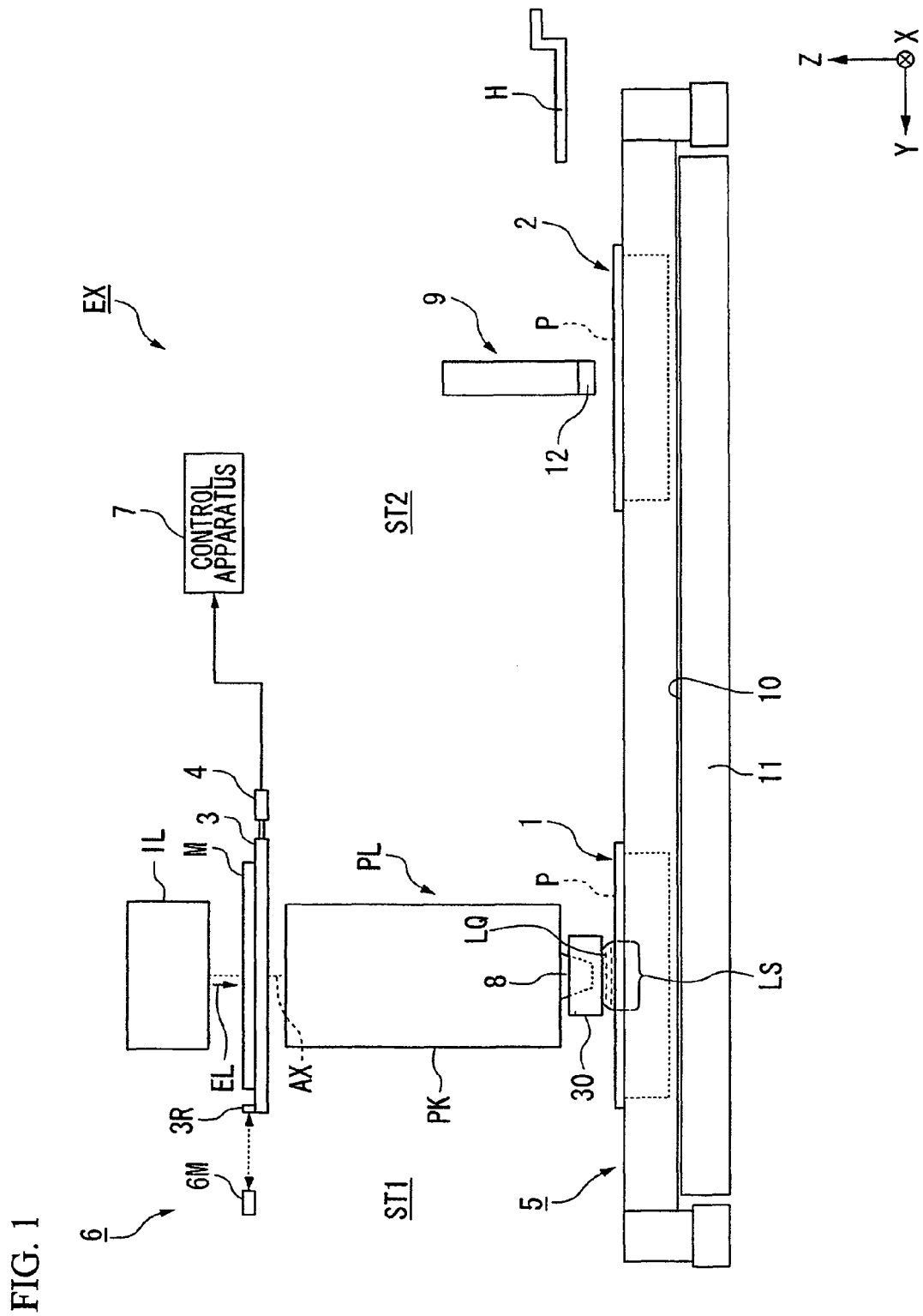
FIG. 1 is a schematic diagram showing an exposure apparatus according to a first embodiment.

A first embodiment will now be described. FIG. 1 is a schematic diagram showing an exposure apparatus EX according to a first embodiment. This embodiment will be described by way of an example where the exposure apparatus EX is a multi-stage (twin-stage) exposure apparatus provided with a plurality of (two) substrate stages 1 and 2 that are movable while holding substrates P, as described in, for example, Japanese Patent Application, Publication No. H10-163099, Japanese Patent Application, Publication No. H10-214783, Published Japanese Translation No. 2000-505958 of the PCT International Publication, Published Japanese Translation No. 2000-511704 of the PCT International Publication, Japanese Patent Application, Publication No. 2000-323404, Japanese Patent Application, Publication No. 2000-505958, Published Japanese Translation No. 2001-513267 of the PCT International Publication, and Japanese Patent Application, Publication No. 2002-158168. In other words, in this embodiment, the exposure apparatus EX includes the first substrate stage 1 which is movable while holding a substrate P and the second substrate stage 2 which is movable while holding a substrate P independently of the first substrate stage 1.

Referring to FIG. 1, the exposure apparatus EX includes a mask stage 3 which is movable while holding a mask M; the first substrate stage 1 which is movable while holding a substrate P; the second substrate stage 2 which is movable while holding a substrate P independently of the first substrate stage 1; a mask-stage driving system 4 which moves the mask stage 3; a substrate-stage driving system 5 which moves the first substrate stage 1 and the second substrate stage 2; a measurement system 6 including laser interferometers for measuring positional information of the stages 1, 2, and 3, respectively; an illumination system IL which illuminates the mask M with exposure light EL; a projection optical system PL which projects onto the substrate P an image of the pattern of the mask M illuminated with the exposure light EL; and a control apparatus 7 which controls the operation of the entire exposure apparatus EX.

The substrate P here is a substrate for manufacturing a device and includes a base material, such as a semiconductor wafer, having a film, such as a photosensitive material (photoresist), formed thereon. The mask M includes a reticle having thereon a device pattern to be projected onto the substrate P. Furthermore, although a transmission mask is used as the mask M in this embodiment, a reflecting mask can also be used. The transmission mask is not limited to a binary mask formed with a pattern by a light shielding film but includes for example a phase shift mask such as of a half tone type or a spatial frequency modulation type.

The exposure apparatus EX includes an exposure station ST1 which emits the exposure light EL onto the substrate P and a measurement station ST2 which performs exposure-related predetermined measurement and exchanges the substrates P. The exposure apparatus EX includes a base plate 11 having a guide surface 10 which movably supports each of the first substrate stage 1 and the second substrate stage 2. The first substrate stage 1 and the second substrate stage 2 can move over the guide surface 10 between the exposure station ST1 and the measurement station ST2 while holding the substrates P. In this embodiment, the guide surface 10 is substantially parallel to the XY plane, and the first substrate stage 1 and the second substrate stage 2 can move along the guide surface 10 in an XY direction (two-dimensional direction).

The illumination system IL, the mask stage 3, the projection optical system PL, and so forth are disposed in the exposure station ST1. The projection optical system PL includes a plurality of optical elements. Of the plurality of optical elements in the projection optical system PL, a terminal optical element 8 which is closest to the image plane of the projection optical system PL includes a light-exit surface (lower surface) for emitting the exposure light EL. The first substrate stage 1 can move adjacent to a light-exit side of the terminal optical element 8 of the projection optical system PL (the image plane side of the projection optical system PL), i.e., the light-exit side from which the exposure light EL is emitted. The second substrate stage 2 can move adjacent to the light-exit side of the terminal optical element 8 of the projection optical system PL (the image plane side of the projection optical system PL) independently of the first substrate stage 1.

Various measuring apparatuses that can perform measurement related to exposure of the substrate P, including an alignment system 9 and a focus leveling detection system (not shown in the figure) for acquiring positional information of the substrate P held on at least one of the first substrate stage 1 and the second substrate stage 2, are disposed in the measurement station ST2. The alignment system 9 has a plurality of optical elements and acquires positional information of the substrate P using those optical elements. The focus leveling detection system also includes a plurality of optical elements and acquires positional information of the substrate P using those optical elements.

A transfer system H for exchanging the substrate P is provided near the measurement station ST2. With the transfer system H, the control apparatus 7 can perform the substrate exchange operation of unloading (carrying out) an exposed substrate P from the first substrate stage 1 (or the second substrate stage 2) that has been moved to a substrate exchange position (loading position) of the measurement station ST2 and loading (carrying in) a substrate P that is to be exposed onto the first substrate stage 1 (or the second substrate stage 2).

The exposure apparatus EX of the present embodiment is an immersion exposure apparatus applicable to an immersion method for substantially shortening the exposure wavelength to improve the resolution and substantially expanding the depth of focus. The exposure apparatus EX includes a nozzle member 30 which can form an immersion space LS of a liquid LQ to fill an optical path space of the exposure light EL with the liquid LQ. The optical path space of the exposure light EL is a space including an optical path on which the exposure light EL travels. The immersion space LS is a space filled with the liquid LQ. The exposure apparatus EX emits the exposure light EL onto the substrate P via the projection optical system PL and the liquid LQ to expose the substrate P.

The nozzle member 30 includes a sealing member as disclosed in, for example, Japanese Patent Application Publication No. 2004-289126 and Japanese Patent Application Publication No. 2004-289128 and is provided with a passage via which the liquid LQ is supplied to and recovered from the optical path space of the exposure light EL. The nozzle member also functions as a confinement member which confines the liquid LQ in a space so that the optical path for the exposure light EL is filled with the liquid LQ. It should be noted that this passage is not shown in the figure. The passage is connected to a liquid supply apparatus which supplies the liquid LQ to the optical path space of the exposure light EL via the passage and a liquid recovery apparatus which recovers the liquid LQ via the passage. The liquid supply apparatus can supply the liquid LQ for forming the immersion space LS to the optical path space of the exposure light EL via the passage, and the liquid recovery apparatus can recover the liquid LQ from the immersion space LS via the passage. In this embodiment, water (pure water) is used as the liquid LQ.

As the nozzle member 30, a member with a structure as disclosed in, for example, PCT International Publication No. WO 2004/086468 or PCT International Publication No. WO 2005/024517 can be used.

The nozzle member 30 can form the immersion space LS between itself and an object that faces the nozzle member 30. In this embodiment, the nozzle member 30 is disposed near the terminal optical element 8 of the projection optical system PL. On the light-exit side of the terminal optical element 8 (the image plane side of the projection optical system PL), the nozzle member 30 can form the immersion space LS between itself and an object located at a position that can be illuminated with the exposure light EL, that is, a position opposing the light-exit surface of the terminal optical element 8. By holding the liquid LQ between itself and the object, the nozzle member 30 forms the immersion space LS of the liquid LQ so as to fill the optical path space of the exposure light EL on the light-exit side of the terminal optical element 8, more specifically, the optical path space of the exposure light EL between the terminal optical element 8 and the object, with the liquid LQ.

Objects that can oppose the nozzle member 30 and the terminal optical element 8 include objects that can move at the light-exit side of the terminal optical element 8. In this embodiment, objects that can oppose the nozzle member 30 and the terminal optical element 8 include at least one of the first substrate stage 1 and the second substrate stage 2 that can move at the light-exit side of the terminal optical element 8. Furthermore, objects that can oppose the nozzle member 30 and the terminal optical element 8 include the substrates P held on the first and second substrate stages 1 and 2. Each of the first and second substrate stages 1 and 2 can move to a position opposing the nozzle member 30 and the terminal optical element 8. By holding the liquid LQ between itself and the first and second stages 1 and 2, the nozzle member 30 can form the immersion space LS of the liquid LQ between the nozzle member 30 and the terminal optical element 8 and the first and second substrate stages 1 and 2 so as to fill the optical path space of the exposure light EL on the light-exit side of the terminal optical element 8 with the liquid LQ.

In this embodiment, the nozzle member 30 forms the immersion space LS between the terminal optical element 8 and the nozzle member 30 and an object (at least one of the first substrate stage 1, the second substrate stage 2, and the substrate P) such that a partial area (local area) on the surface of the object is covered with the liquid LQ of the immersion space LS. More specifically, in this embodiment, the exposure apparatus EX employs a local liquid immersion method for forming the immersion space LS between the terminal optical element 8 and the nozzle member 30 and the substrate P such that a partial area on the substrate P is covered with the liquid LQ of the immersion space LS at least during exposure of the substrate P.

The alignment system 9 of the measurement station ST2 includes an optical element 12 that can oppose an object (at least one of the first substrate stage 1, the second substrate stage 2, and the substrate P). Each of the first substrate stage 1 and the second substrate stage 2 can move to a position opposing the optical element 12 of the alignment system 9. In order to acquire positional information of the substrate P held on at least one of the first substrate stage 1 and the second substrate stage 2, the alignment system 9 detects, for example, an alignment mark on the substrate P and reference marks on the first and second substrate stages 1 and 2 via the optical element 12.

In the following description, the terminal optical element 8 of the projection optical system PL disposed in the exposure station ST1, i.e., the terminal optical element 8 from which the exposure light EL is emitted, is referred to as the first optical element 8 as appropriate. Also, the optical element 12 of the alignment system 9 for acquiring positional information of the substrate P, disposed in the measurement station ST2, is referred to as the second optical element 12, as appropriate. Furthermore, a position opposing the first optical element 8 is referred to as a first position as appropriate, and a position opposing the second optical element 12 is referred to as a second position as appropriate.

Thus, while holding the substrates P, the first substrate stage 1 and the second substrate stage 2 can move in predetermined areas, over the guide surface 10, including the first position opposing the first optical element 8 and the second position opposing the second optical element 12, respectively.

The exposure apparatus EX of the present embodiment is a scanning type exposure apparatus (a so-called scanning stepper) which exposes the image of the pattern of the mask M onto the substrate P while the mask M and the substrate P are synchronously moved in a predetermined scanning direction. In this embodiment, a scanning direction (synchronous-movement direction) of the substrate P is defined as a Y axial direction, and a scanning direction (synchronous-movement direction) of the mask M is also defined as the Y axial direction. The exposure apparatus EX emits the exposure light EL onto the substrate P via the projection optical system PL and the liquid LQ to expose the substrate P while moving the substrate P in the Y axial direction with respect to the projection area of the projection optical system PL and, furthermore, moving the mask M in the Y axial direction with respect to the illumination area of the illumination system IL in synchronization with the movement of the substrate P in the Y axial direction. By doing so, the image of the pattern of the mask M is projected onto the substrate P.

The illumination system IL illuminates a predetermined illumination area on the mask M with the exposure light EL of uniform luminance distribution. As the exposure light EL radiated from the illumination system IL, deep-ultraviolet beams (DUV light beams) such as emission lines (g-ray, h-ray, i-ray) radiated from a mercury lamp and a KrF excimer laser beam (wavelength: 248 nm), vacuum ultraviolet light beams (VUV light beams) such as an ArF excimer laser beam (wavelength: 193 nm) and an F2 laser beam (wavelength: 157 nm), and so forth may be used. In this embodiment, the ArF excimer laser beam is used as the exposure light EL.

The mask stage 3 can move in the X axis, Y axis, and θZ directions while holding the mask M with the mask-stage driving system 4 including an actuator such as a linear motor. Positional information of the mask stage 3 (the mask M) is measured by a laser interferometer 6M of the measurement system 6. The laser interferometer 6M measures positional information about the X axis, Y axis, and θZ directions of the mask stage 3 using a measuring mirror 3R provided on the mask stage 3. The control apparatus 7 drives the mask-stage driving system 4 based on a measurement result of the measurement system 6 and controls the position of the mask M held on the mask stage 3.

The projection optical system PL projects the image of the pattern of the mask M onto the substrate P at a predetermined projection magnification. The projection optical system PL has a plurality of optical elements, which are supported by a lens barrel PK. In the present embodiment, the projection optical system PL is a reduction system having a projection magnification of, for example, ¼, ⅕, or ⅛. The projection optical system PL may be reduction system, an equal system, or a magnification system. In this embodiment, an optical axis AX of the projection optical system PL is parallel to the Z axial direction. Furthermore, the projection optical system PL may be any of a refractive system which does not include a reflection optical element; a reflection system which does not include a refractive optical element; and a cata-dioptric system which includes a reflection optical system and a refractive optical system. Moreover, the projection optical system PL may form either an inverted image or an erect image.

The exposure light EL which has been emitted from the illumination system IL and has passed through the mask M enters the projection optical system PL from the object plane side of the projection optical system PL. The projection optical system PL can emit the exposure light EL, which has been received via the object plane side, from the light-exit surface (lower surface) of the first optical element 8 to illuminate the substrate P.

Figure 2A:
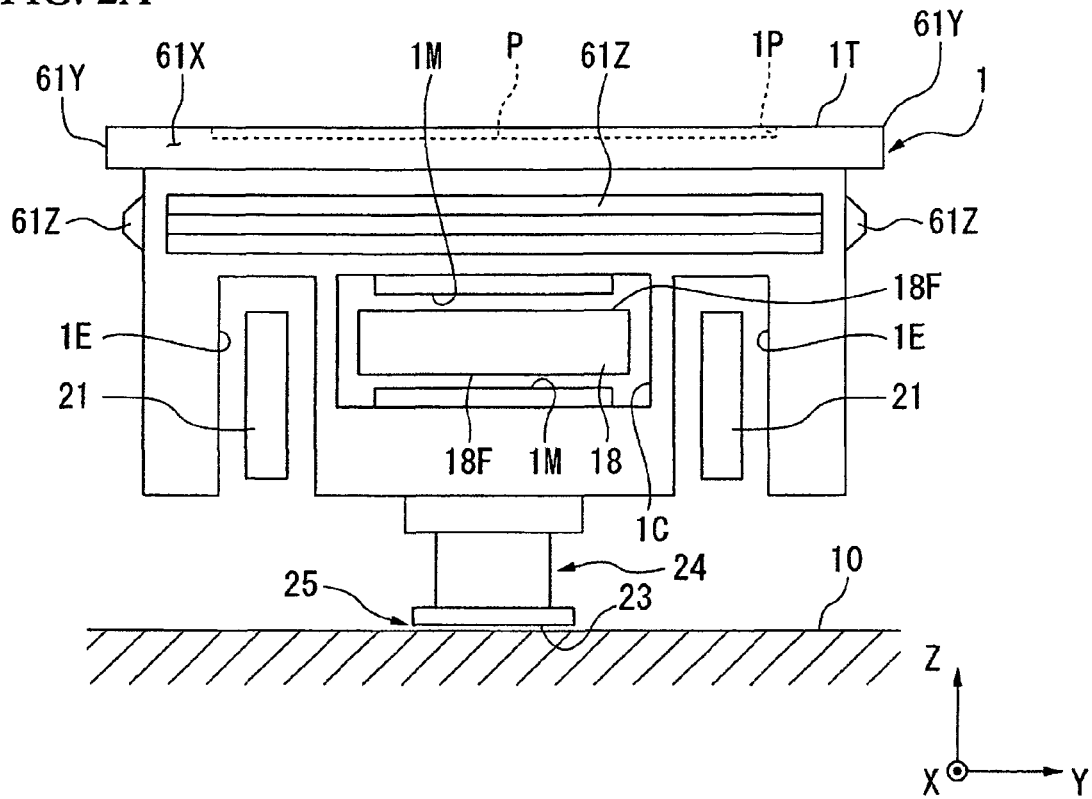
FIG. 2A is a diagram showing a first substrate stage according to the first embodiment.
Figure 2B:
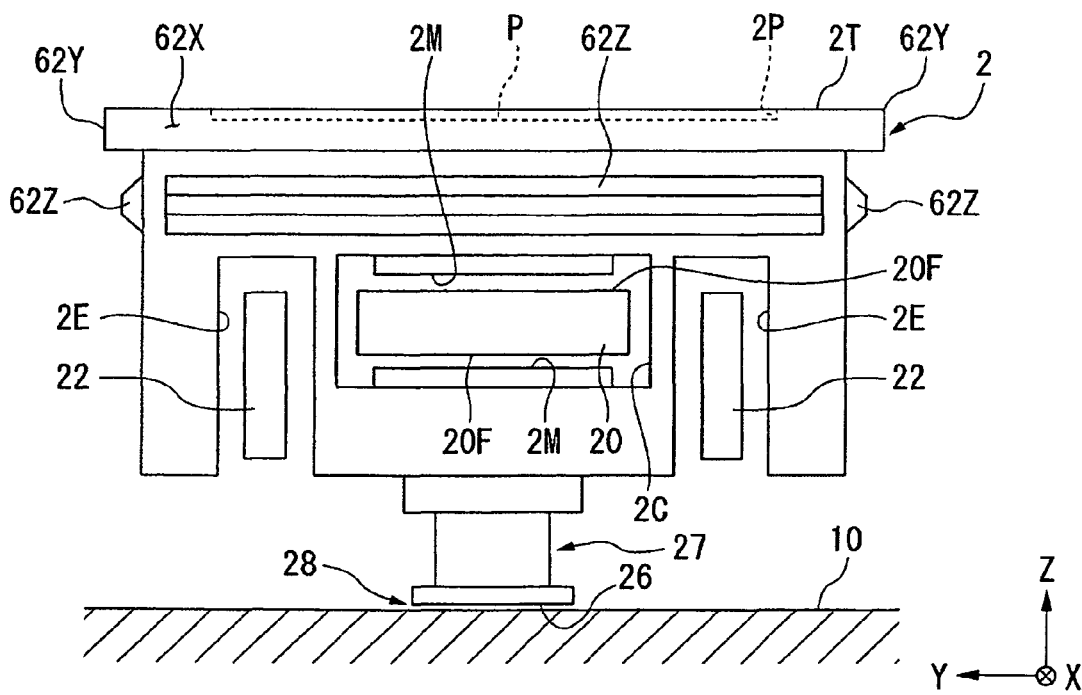
FIG. 2B is a diagram showing a second substrate stage according to the first embodiment.
Figure 3:
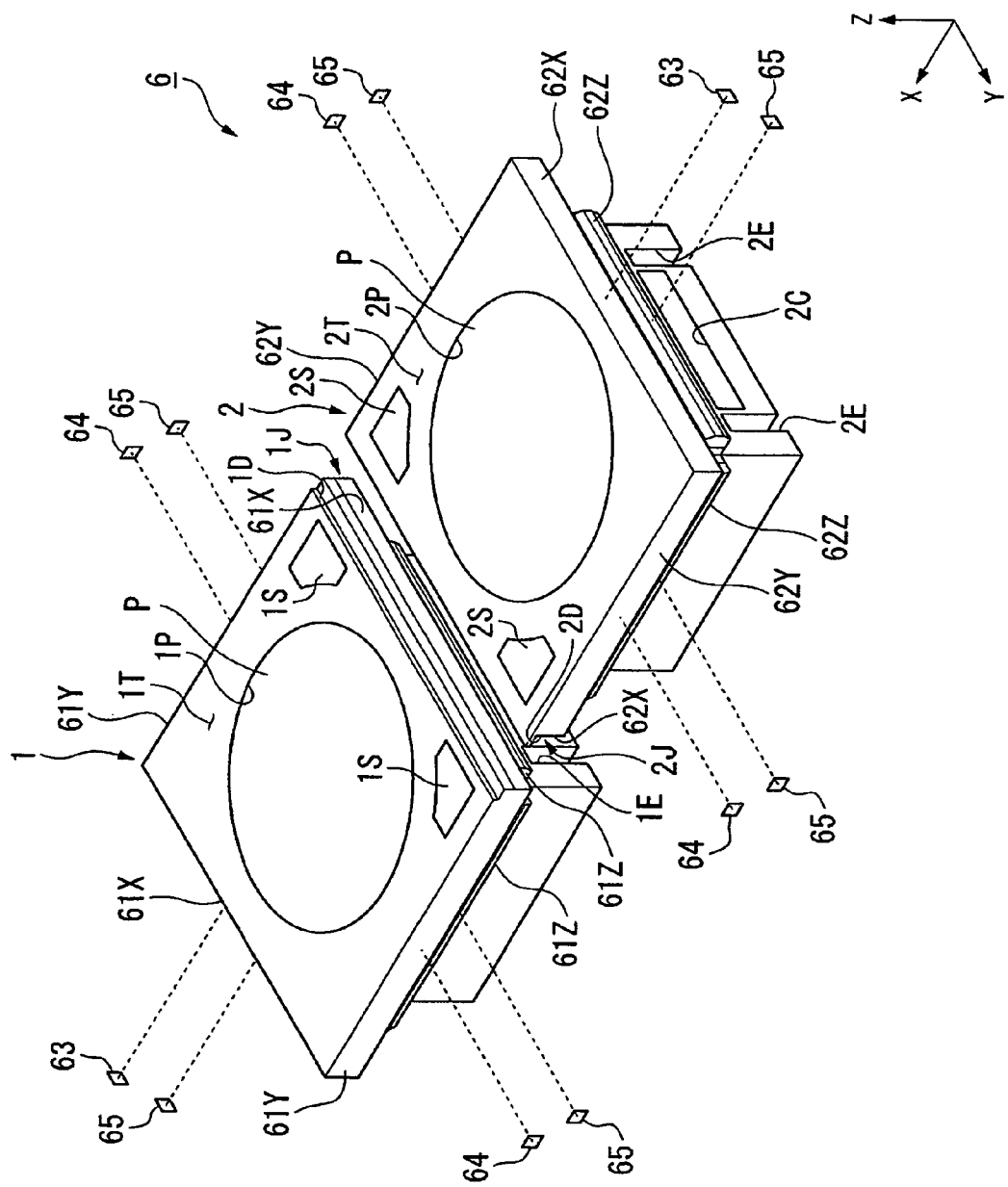
FIG. 3 is a perspective view of first and second substrate stages according to the first embodiment.
Figure 4:
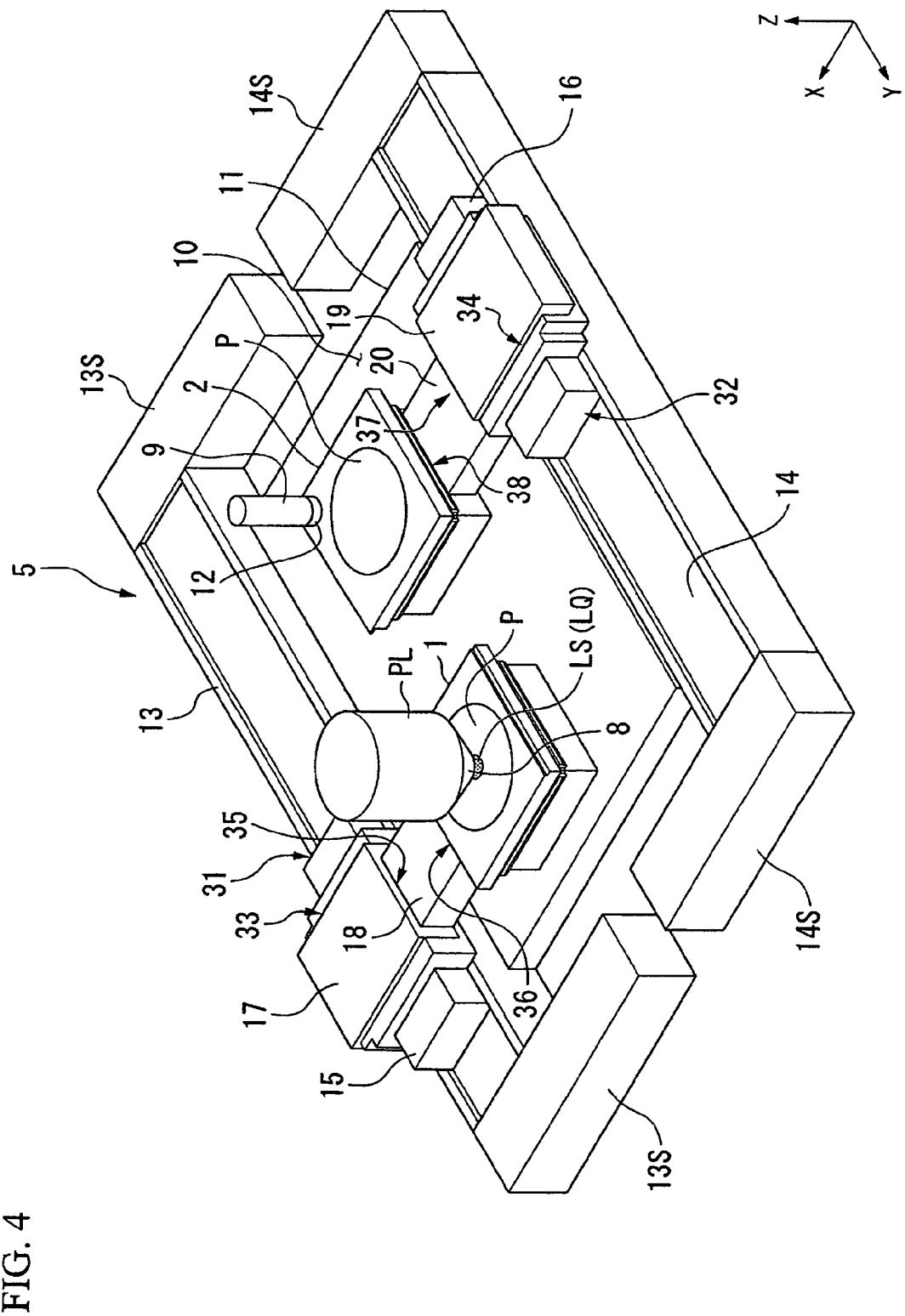
FIG. 4 is a perspective view of first and second substrate stages and a substrate-stage driving system according to the first embodiment.
Figure 5:
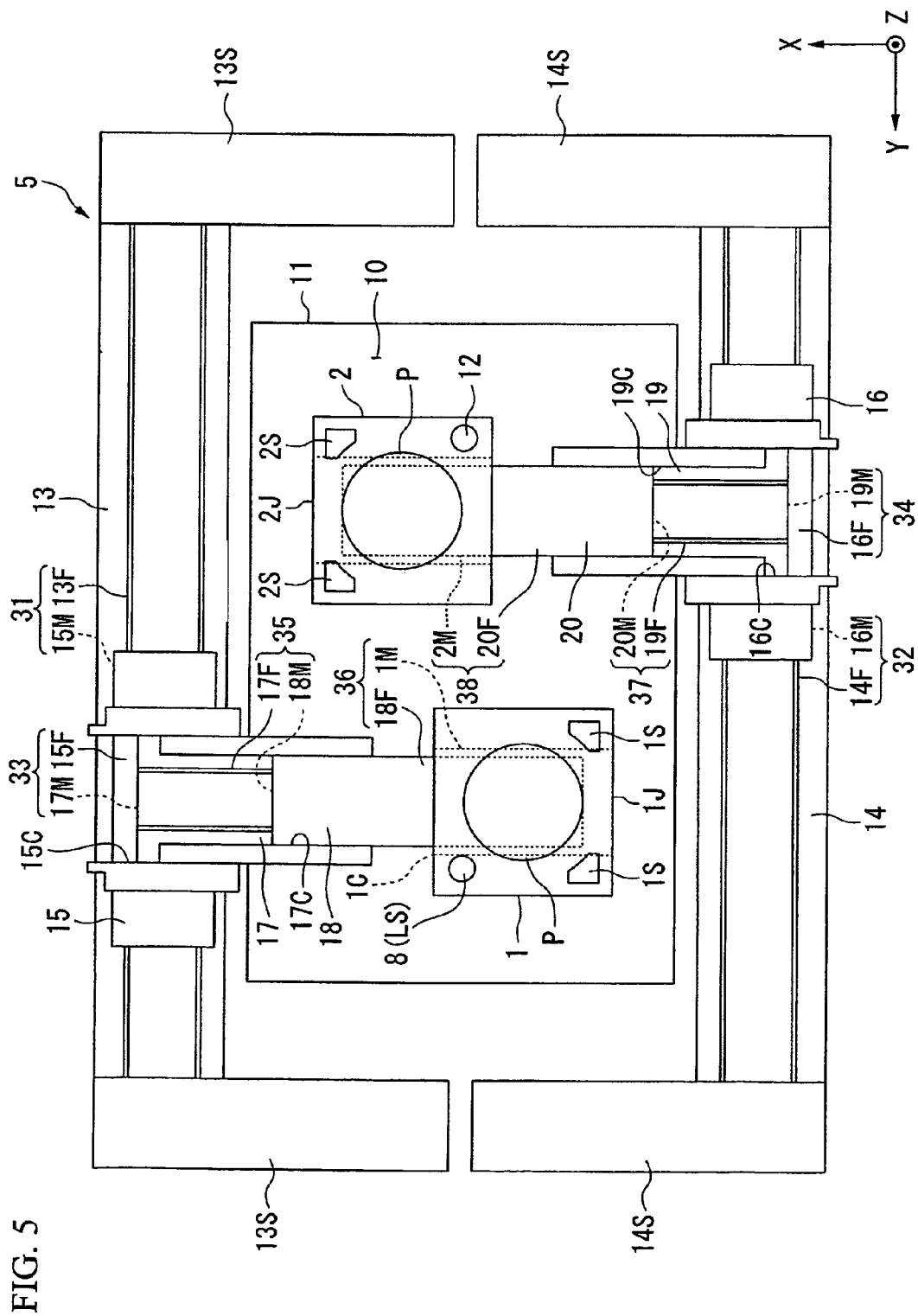
FIG. 5 is a plan view of first and second substrate stages and a substrate-stage driving system according to the first embodiment.

The first and second substrate stages 1 and 2 and the substrate-stage driving system 5 will be described with reference to FIG. 2A, FIG. 2B, FIG. 3, FIG. 4, and FIG. 5. FIG. 2A is a side view of the first substrate stage 1. FIG. 2B is a side view of the second substrate stage 2. FIG. 3 is a perspective view of the first substrate stage 1 and the second substrate stage 2 which are positioned with a predetermined positional relationship. In addition, FIG. 4 is a perspective view of the first and second substrate stages 1 and 2 and the substrate-stage driving system 5. FIG. 5 is a plan view of the first and second substrate stages 1 and 2 and the substrate-stage driving system 5. Part (near sliding members 15, 17, 16, and 19, which will be described later) of FIG. 5 is shown in sectional view.

The first substrate stage 1 has a substrate holder which detachably supports the substrate P and can move over the guide surface 10 while supporting the substrate P. As shown in FIG. 2A, a support device 24 including an aerostatic bearing 23 as disclosed in, for example, PCT International Publication No. WO 2006/009254 is provided on the lower surface of the first substrate stage 1. A first gas bearing 25 is formed by the support device 24 between the first substrate stage 1 and the guide surface 10. The first substrate stage 1 is supported by the first gas bearing 25 without contacting the guide surface 10.

The first substrate stage 1 has a recess portion 1P, and the substrate holder is disposed in the recess portion 1P. An upper surface 1T around the recess portion 1P of the first substrate stage 1 is substantially flat and is substantially aligned (flush) with the surface of the substrate P held by the substrate holder. In short, the first substrate stage 1 has the upper surface 1T which is substantially flush with the surface of the substrate P held by the substrate holder of the first substrate stage 1. In this embodiment, the upper surface 1T and the XY plane are substantially parallel. While holding the substrate P by the substrate holder, the first substrate stage 1 can move in a direction of six degrees of freedom of the X axis, Y axis, Z axis, θX, θY, and θZ directions over the guide surface 10 using the substrate-stage driving system 5.

The second substrate stage 2 has a substrate holder which detachably supports the substrate P and can move over the guide surface 10 while holding the substrate P. As shown in FIG. 2B, a support device 27 including an aerostatic bearing 26 as disclosed in, for example, PCT International Publication No. WO 2006/009254 is provided on the lower surface of the second substrate stage 2. A second gas bearing 28 is formed by the support device 27 between the second substrate stage 2 and the guide surface 10. The second substrate stage 2 is supported by the second gas bearing 28 without contacting the guide surface 10.

The second substrate stage 2 has a recess portion 2P, and the substrate holder is disposed in the recess portion 2P. An upper surface 2T around the recess portion 2P of the second substrate stage 2 is substantially flat and is substantially aligned (flush) with the surface of the substrate P held by the substrate holder. In short, the second substrate stage 2 has upper surface 2T which is substantially flush with the surface of the substrate P held by the substrate holder of the second substrate stage 2. In this embodiment, the upper surface 2T and the XY plane are substantially parallel. While holding the substrate P by the substrate holder, the second substrate stage 2 can move in a direction of six degrees of freedom of the X axis, Y axis, Z axis, θX, θY, and θZ directions over the guide surface 10 using the substrate-stage driving system 5.

In this embodiment, the first substrate stage 1 and the second substrate stage 2 are substantially same in shape and size and have substantially the same structure. In this embodiment, the first and second substrate stages 1 and 2 are substantially rectangular in the XY plane.

The substrate-stage driving system 5 includes an actuator, such as a linear motor, and can move each of the first substrate stage 1 and the second substrate stage 2 over the guide surface 10.

As shown in FIG. 4 and FIG. 5, in this embodiment, the substrate-stage driving system 5 includes a first linear motor 31 for moving the first substrate stage 1 in the Y axial direction of the guide surface 10; a second linear motor 32 for moving the second substrate stage 2 in the Y axial direction of the guide surface 10; a third linear motor 33, a fifth linear motor 35, and a sixth linear motor 36 for moving the first substrate stage 1 in the X axial direction of the guide surface 10; and a fourth linear motor 34, a seventh linear motor 37, and an eighth linear motor 38 for moving the second substrate stage 2 in the X axial direction of the guide surface 10.

Furthermore, in this embodiment, the substrate-stage driving system 5 includes a first guide member 13 and a second guide member 14 elongated in the Y axial direction; a first sliding member 15 which is supported by the first guide member 13 such that it is movable in the Y axial direction; a second sliding member 16 which is supported by the second guide member 14 such that it is movable in the Y axial direction; a third sliding member 17 which is supported by the first sliding member 15 such that it is movable in the X axial direction; a fourth sliding member 18 which is supported by the third sliding member 17 such that it is movable in the X axial direction; a fifth sliding member 19 which is supported by the second sliding member 16 such that it is movable in the X axial direction; and a sixth sliding member 20 which is supported by the fifth sliding member 19 such that it is movable in the X axial direction. The fourth sliding member 18 supports the first substrate stage 1 such that it is movable in the X axial direction. The sixth sliding member 20 supports the second substrate stage 2 such that it is movable in the X axial direction.

Each of the first guide member 13 and the second guide member 14 is a member which is elongated in the Y axial direction, and the first guide member 13 and the second guide member 14 are separated from each other at a predetermined interval in the X axial direction. Both ends of the first guide member 13 in the Y axial direction are supported by first support mechanisms 13S. Both ends of the second guide member 14 in the Y axial direction are supported by second support mechanisms 14S. Each of the first support mechanisms 13S and the second support mechanisms 14S is disposed outside the base plate 11 with respect to the Y axial direction.

As shown in FIG. 5, the first linear motor 31 for moving the first substrate stage 1 in the Y axial direction has a stator 13F and a slider 15M which operates in conjunction with the stator 13F. The second linear motor 32 for moving the second substrate stage 2 in the Y axial direction includes a stator 14F and a slider 16M which operates in conjunction with the stator 14F.

The stator 13F is provided on the first guide member 13. The first guide member 13 movably supports one end of the first substrate stage 1 via the first, third, and fourth sliding members 15, 17, and 18. The stator 14F is provided on the second guide member 14. The second guide member 14 movably supports one end of the second substrate stage 2 via the second, fifth, and sixth sliding members 16, 19, and 20.

The stator 13F includes, for example, a magnet unit and is disposed on a surface of the first guide member 13, more specifically, on the surface opposing the first sliding member 15. The slider 15M includes, for example, a coil unit and is disposed on a surface of the first sliding member 15, more specifically, on the surface opposing the first guide member 13. The first linear motor 31, which includes the stator 13F and the slider 15M, can move the first sliding member 15 in the Y axial direction along the first guide member 13.

The stator 14F includes, for example, a magnet unit and is disposed on a surface of the second guide member 14, more specifically, on the surface opposing the second sliding member 16. The slider 16M includes, for example, a coil unit and is disposed on a surface of the second sliding member 16, more specifically, on the surface opposing the second guide member 14. The second linear motor 32, which includes the stator 14F and the slider 16M, can move the second sliding member 16 in the Y axial direction along the second guide member 14.

The third linear motor 33 for moving the first substrate stage 1 in the X axial direction has a stator 15F connected to the slider 15M via the first sliding member 15 and a slider 17M which operates in conjunction with the stator 15F and can move the first substrate stage 1 in the X axial direction via the third and fourth sliding members 17 and 18.

The stator 15F includes, for example, a magnet unit and is disposed on a surface of the first sliding member 15, more specifically, on the surface opposing the third sliding member 17. The slider 17M includes, for example, a coil unit and is disposed on a surface of the third sliding member 17, more specifically, on the surface opposing the first sliding member 15. The third linear motor 33, which includes the stator 15F and the slider 17M, can move the third sliding member 17 in the X axial direction with respect to the first sliding member 15. In this embodiment, a guide part 15C for guiding the movement of the third sliding member 17 in the X axial direction is provided on the first sliding member 15, and the third sliding member 17 moves in the X axial direction while being guided by the guide part 15C.

As described above, the slider 15M is disposed on a surface of the first sliding member 15, more specifically, on the surface opposing the first guide member 13, and the stator 15F is disposed on a surface of the first sliding member 15, more specifically, on the surface opposing the third sliding member 17. In short, in this embodiment, the slider 15M and the stator 15F are connected via the first sliding member 15.

The fourth linear motor 34 for moving the second substrate stage 2 in the X axial direction has a stator 16F connected to the slider 16M via the second sliding member 16 and a slider 19M which operates in conjunction with the stator 16F and can move the second substrate stage 2 in the X axial direction via the fifth and sixth sliding members 19 and 20.

The stator 16F includes, for example, a magnet unit and is disposed on a surface of the second sliding member 16, more specifically, on the surface opposing the fifth sliding member 19. The slider 19M includes, for example, a coil unit and is disposed on a surface of the fifth sliding member 19, more specifically, on the surface opposing the second sliding member 16. The fourth linear motor 34, which includes the stator 16F and the slider 19M, can move the fifth sliding member 19 in the X axial direction with respect to the second sliding member 16. In this embodiment, a guide part 16C for guiding the movement of the fifth sliding member 19 in the X axial direction is provided on the second sliding member 16, and the fifth sliding member 19 moves in the X axial direction while being guided by the guide part 16C.

As described above, the slider 16M is disposed on a surface of the second sliding member 16, more specifically, on the surface opposing the second guide member 14, and the stator 16F is disposed on a surface of the second sliding member 16, more specifically, on the surface opposing the fifth sliding member 19. In short, in this embodiment, the slider 16M and the stator 16F are connected via the second sliding member 16.

The fifth linear motor 35 for moving the first substrate stage 1 in the X axial direction has a stator 17F connected to the slider 17M via the third sliding member 17 and a slider 18M which operates in conjunction with the stator 17F and can move the first substrate stage 1 in the X axial direction via the fourth sliding member 18.

The stator 17F includes, for example, a magnet unit and is disposed on a surface of the third sliding member 17, more specifically, on the surface opposing the fourth sliding member 18. The slider 18M includes, for example, a coil unit and is disposed on a surface of the fourth sliding member 18, more specifically, on the surface opposing the third sliding member 17. The fifth linear motor 35, which includes the stator 17F and the slider 18M, can move the fourth sliding member 18 in the X axial direction with respect to the third sliding member 17. In this embodiment, a guide part 17C for guiding the movement of the fourth sliding member 18 in the X axial direction is provided on the third sliding member 17, and the fourth sliding member 18 moves in the X axial direction while being guided by the guide part 17C.

As described above, the slider 17M is disposed on a surface of the third sliding member 17, more specifically, on the surface opposing the first sliding member 15, and the stator 17F is disposed on a surface of the third sliding member 17, more specifically, on the surface opposing the fourth sliding member 18. In short, in this embodiment, the slider 17M and the stator 17F are connected via the third sliding member 17.

The sixth linear motor 36 for moving the first substrate stage 1 in the X axial direction has a stator 18F connected to the slider 18M via the fourth sliding member 18 and a slider 1M which operates in conjunction with the stator 18F and can move the first substrate stage 1 in the X axial direction.

The stator 18F includes, for example, a magnet unit and is disposed on a surface of the fourth sliding member 18, more specifically, on the surface opposing the inner surface of an opening 1C formed in the first substrate stage 1. The opening 1C of the first substrate stage 1 is formed so as to pass therethrough in the X axial direction and can accommodate the fourth sliding member 18. The slider 1M includes, for example, a coil unit and is disposed on the first substrate stage 1, more specifically, on the inner surface of the opening 1C which opposes the fourth sliding member 18. The sixth linear motor 36, which includes the stator 18F and the slider 1M, can move the first substrate stage 1 in the X axial direction with respect to the fourth sliding member 18.

As described above, the slider 18M is disposed on a surface of the fourth sliding member 18, more specifically, on the surface opposing the third sliding member 17, and the stator 18F is disposed on a surface of the fourth sliding member 18, more specifically, on the surface opposing the inner surface of the opening 1C formed in the first substrate stage 1. In short, in this embodiment, the slider 18M and the stator 18F are connected via the fourth sliding member 18.

In this embodiment, the stator 18F of the sixth linear motor 36 is disposed in an area to the −X side from a substantially central point, in the X axial direction, of the fourth sliding member 18. The slider 18M of the fifth linear motor 35 is disposed in an area to the +X side from the stator 18F on the fourth sliding member 18. The sixth linear motor 36, which includes the stator 18F and the slider 1M, finely moves the first substrate stage 1 in the X axial direction near an end portion on the −X side of the fourth sliding member 18.

The seventh linear motor 37 for moving the second substrate stage 2 in the X axial direction has a stator 19F connected to the slider 19M via the fifth sliding member 19 and a slider 20M which operates in conjunction with the stator 19F and can move the second substrate stage 2 in the X axial direction via the sliding member 20.

The stator 19F includes, for example, a magnet unit and is disposed on a surface of the fifth sliding member 19, more specifically, on the surface opposing the sixth sliding member 20. The slider 20M includes, for example, a coil unit and is disposed on a surface of the sixth sliding member 20, more specifically, on the surface opposing the fifth sliding member 19. The seventh linear motor 37, which includes the stator 19F and the slider 20M, can move the sixth sliding member 20 in the X axial direction with respect to the fifth sliding member 19. In this embodiment, a guide part 19C for guiding the movement of the sixth sliding member 20 in the X axial direction is provided on the fifth sliding member 19, and the sixth sliding member 20 moves in the X axial direction while being guided by the guide part 19C.

As described above, the slider 19M is disposed on a surface of the fifth sliding member 19, more specifically, on the surface opposing the second sliding member 16, and the stator 19F is disposed on a surface of the fifth sliding member 19, more specifically, on the surface opposing the sixth sliding member 20. In short, in this embodiment, the slider 19M and the stator 19F are connected via the fifth sliding member 19.

The eighth linear motor 38 for moving the second substrate stage 2 in the X axial direction has a stator 20F connected to the slider 20M via the sixth sliding member 20 and a slider 2M which operates in conjunction with the stator 20F and can move the second substrate stage 2 in the X axial direction.

The stator 20F includes, for example, a magnet unit and is disposed on the sixth sliding member 20, more specifically, on the surface opposing the inner surface of an opening 2C formed in the second substrate stage 2. The opening 2C of the second substrate stage 2 is formed so as to pass therethrough in the X axial direction and can accommodate the sixth sliding member 20. The slider 2M includes, for example, a coil unit and is disposed on the second substrate stage 2, more specifically, on the inner surface of the opening 2C which opposes the sixth sliding member 20. The eighth linear motor 38, which includes the stator 20F and the slider 2M, can move (finely move) the second substrate stage 2 in the X axial direction with respect to the sixth sliding member 20.

As described above, the slider 20M is disposed on a surface of the sixth sliding member 20, more specifically, on the surface opposing the fifth sliding member 19, and the stator 20F is disposed on the sixth sliding member 20, more specifically, on the surface opposing the inner surface of the opening 2C formed in the second substrate stage 2. In short, in this embodiment, the slider 20M and the stator 20F are connected via the sixth sliding member 20.

In this embodiment, the stator 20F of the eighth linear motor 38 is disposed in an area to the +X side from a substantially central point, in the X axial direction, of the sixth sliding member 20. The slider 20M of the seventh linear motor 37 is disposed in an area to the −X side from the stator 20F on the sixth sliding member 20. The eighth linear motor 38, which includes the stator 20F and the slider 2M, finely moves the second substrate stage 2 in the X axial direction near an end portion on the +X side of the sixth sliding member 20.

The substrate-stage driving system 5 moves the third and fourth sliding members 17 and 18 and the first substrate stage 1 in the Y axial direction together with the first sliding member 15 by moving the first sliding member 15 in the Y axial direction with the first linear motor 31. In addition, the substrate-stage driving system 5 moves the first substrate stage 1 in the X axial direction with the third, fifth, and sixth linear motors 33, 35, and 36. The substrate-stage driving system 5 can move the first substrate stage 1 between the exposure station ST1 and the measurement station ST2 with these linear motors 31, 33, 35, and 36.

The substrate-stage driving system 5 moves the fifth and sixth sliding members 19 and 20 and the second substrate stage 2 in the Y axial direction together with the second sliding member 16 by moving the second sliding member 16 in the Y axial direction with the second linear motor 32. Furthermore, the substrate-stage driving system 5 moves the second substrate stage 2 in the X axial direction with the fourth, seventh, and eighth linear motors 34, 37, and 38. The substrate-stage driving system 5 can move the second substrate stage 2 between the exposure station ST1 and the measurement station ST2 with these linear motors 32, 34, 37, and 38.

Furthermore, as shown in FIG. 2A, in the first substrate stage 1, a groove 1E is formed near each end of the fourth sliding member 18 in the Y axial direction. An actuator 21, such as a voice coil motor, which is driven by Lorentz's force is disposed in each groove 1E. The substrate-stage driving system 5 can move (finely move) the first substrate stage 1 in the Z axis and θY directions with respect to the fourth sliding member 18 using the actuators 21 (e.g., VCM).

Furthermore, as shown in FIG. 2B, in the second substrate stage 2, a groove 2E is formed near each end of the sixth sliding member 20 in the Y axial direction. An actuator 22, such as a voice coil motor, which is driven by Lorentz's force is disposed in each groove 2E. The substrate-stage driving system 5 can move (finely move) the second substrate stage 2 in the Z axis and θY directions with the actuators 22 with respect to the sixth sliding member 20.

In this manner, according to this embodiment, the substrate-stage driving system 5 can move each of the first substrate stage 1 and the second substrate stage 2 in a direction of six degrees of freedom of the X axis, Y axis, Z axis, θX, θY, and θZ directions.

The first guide member 13 may be supported by the first support mechanisms 13S so as to be movable in an XY direction, so that a reaction force resulting from the movement of the first substrate stage 1 in an XY direction may be relieved by the first guide member 13. In other words, the first guide member 13 may be allowed to function as a countermass that relieves the reaction force resulting from the movement of the first substrate stage 1. Furthermore, since the first guide member 13 functioning as a countermass by relieving the reaction force resulting from the movement of the first substrate stage 1 is dislocated, a so-called trim motor for controlling the position of the first guide member 13 can be provided. Similarly, the second guide member 14 may be supported with the second support mechanisms 14S so as to be movable in an XY direction, so that the second guide member 14 can be allowed to function as a countermass that relieves the reaction force resulting from the movement of the second substrate stage 2 in an XY direction. Furthermore, a trim motor for controlling the position of the second guide member 14 functioning as a countermass can be provided.

As the substrate-stage driving system 5 for driving the first substrate stage 1 and the second substrate stage 2, a system with the structure disclosed in, for example, Japanese Patent Application Publication No. 2003-17404 or Japanese Patent Application Publication No. 2005-32812 can be used.

As will be described later, in this embodiment, the first substrate stage 1 and the second substrate stage 2 are synchronously moved in the X axial direction while part of the end face on the −X side of the first substrate stage 1 is close to or in contact with part of the end face on the +X side of the second substrate stage 2. As shown in, for example, FIG. 3, a step 1D is formed on the −X-side end-face of the first substrate stage 1. Furthermore, as shown in, for example, FIG. 3, a step 2D corresponding to (fitted in) the step 1D of the first substrate stage 1 is formed on the +X-side end-face of the second substrate stage 2. In the following description, when the first substrate stage 1 and the second substrate stage 2 are synchronously moved in the X axial direction while the first substrate stage 1 is close to or in contact with the second substrate stage 2, the end face on the −X side of the first substrate stage 1, i.e., the end face which opposes the second substrate stage 2 is referred to as a first opposing surface 1J as appropriate, and the end face on the +X side of the second substrate stage 2, i.e., the end face which opposes the first substrate stage 1 is referred to as a second opposing surface 2J as appropriate.

In this embodiment, in a predetermined position on the upper surface 1T of the first substrate stage 1, there are provided measurement regions 1S where a photosensor that can measure the exposure light EL is disposed. The measurement regions 1S are provided at two locations adjacent to the first opposing surface 1J on the upper surface 1T of the first substrate stage 1. More specifically, the measurement regions 1S are provided in the −X-side, +Y-side corner and the −X-side, −Y-side corner on the upper surface 1T of the first substrate stage 1.

Similarly, in a predetermined position on the upper surface 2T of the second substrate stage 2, there are provided measurement regions 2S where a photosensor that can measure the exposure light EL is disposed. The measurement regions 2S are provided at two locations adjacent to the second opposing surface 2J on the upper surface 2T of the second substrate stage 2. More specifically, the measurement regions 2S are provided in the +X-side, +Y-side corner and the +X-side, −Y-side corner on the upper surface 2T of the second substrate stage 2.

Next, one example of the measurement system 6 which measures positional information of the first and second substrate stages 1 and 2 will be described with reference to FIG. 2A, FIG. 2B, FIG. 3, FIG. 6, and FIG. 7. The first substrate stage 1 and the second substrate stage 2 include measuring mirrors 61X, 61Y, 61Z, 62X, 62Y, and 62Z which are illuminated with measuring light from the measurement system 6 for measuring the positions of the first substrate stage 1 and the second substrate stage 2.

The measurement system 6 includes laser interferometers 63, 64, and 65 that can illuminate the measuring mirrors 61X, 61Y, 61Z, 62X, 62Y, and 62Z with measuring light for position measurement. The measurement system 6 can illuminate each of the measuring mirrors 61X, 61Y, 61Z, 62X, 62Y, and 62Z provided at predetermined positions on the first and second substrate stages 1 and 2 with measuring light for position measurement to measure positional information of the first and second substrate stages 1 and 2.

The laser interferometer 63 can illuminate the measuring mirrors 61X, 61Z, 62X, and 62Z with measuring light, the laser interferometer 64 can illuminate the measuring mirrors 61Y, 61Z, 62Y, and 62Z with measuring light, and the laser interferometer 65 can illuminate the measuring mirrors 61Z and 62Z with measuring light. In the following description, the laser interferometer 63 is referred to as the X interferometer 63 as appropriate, the laser interferometer 64 is referred to as the Y interferometer 64 as appropriate, and the laser interferometer 65 is referred to as the Z interferometer 65 as appropriate.

A plurality of each of the X, Y, and Z interferometers 63, 64, and 65 is provided. The X, Y, and Z interferometers 63, 64, and 65 are provided on each of the exposure station ST1 the measurement station ST2. The X, Y, and Z interferometers 63, 64, and 65 provided on the exposure station ST1 measure positional information of the first substrate stage 1 (or the second substrate stage 2) that exists in the exposure station ST1. The X, Y, and Z interferometers 63, 64, and 65 provided on the measurement station ST2 measure positional information of the second substrate stage 2 (or the first substrate stage 1) that exists in the measurement station ST2.

The measuring mirror 61X is disposed on the +X-side surface (end face) and on the −X-side surface (end face) of the first substrate stage 1. The reflecting surfaces of the measuring mirrors 61X are substantially parallel to the YZ plane. The measuring mirror 61Y is disposed on the +Y-side surface (end face) and on the −Y-side surface (end face) of the first substrate stage 1. The reflecting surfaces of the measuring mirrors 61Y are substantially parallel to the XZ plane.

The measuring mirror 62X is disposed on the +X-side surface (end face) and on the −X-side surface (end face) of the second substrate stage 2. The reflecting surfaces of the measuring mirrors 62X are substantially parallel to the YZ plane. The measuring mirror 62Y is disposed on the +Y-side surface (end face) and on the −Y-side surface (end face) of the second substrate stage 2. The reflecting surfaces of the measuring mirrors 62Y are substantially parallel to the XZ plane.

The measuring mirror 61Z is disposed at a predetermined location on each of the +X-side surface, −X-side surface, +Y-side surface, and −Y-side surface of the first substrate stage 1. The measuring mirror 62Z is disposed at a predetermined location on each of the +X-side surface, −X-side surface, +Y-side surface, and −Y-side surface of the second substrate stage 2.

Figure 6:
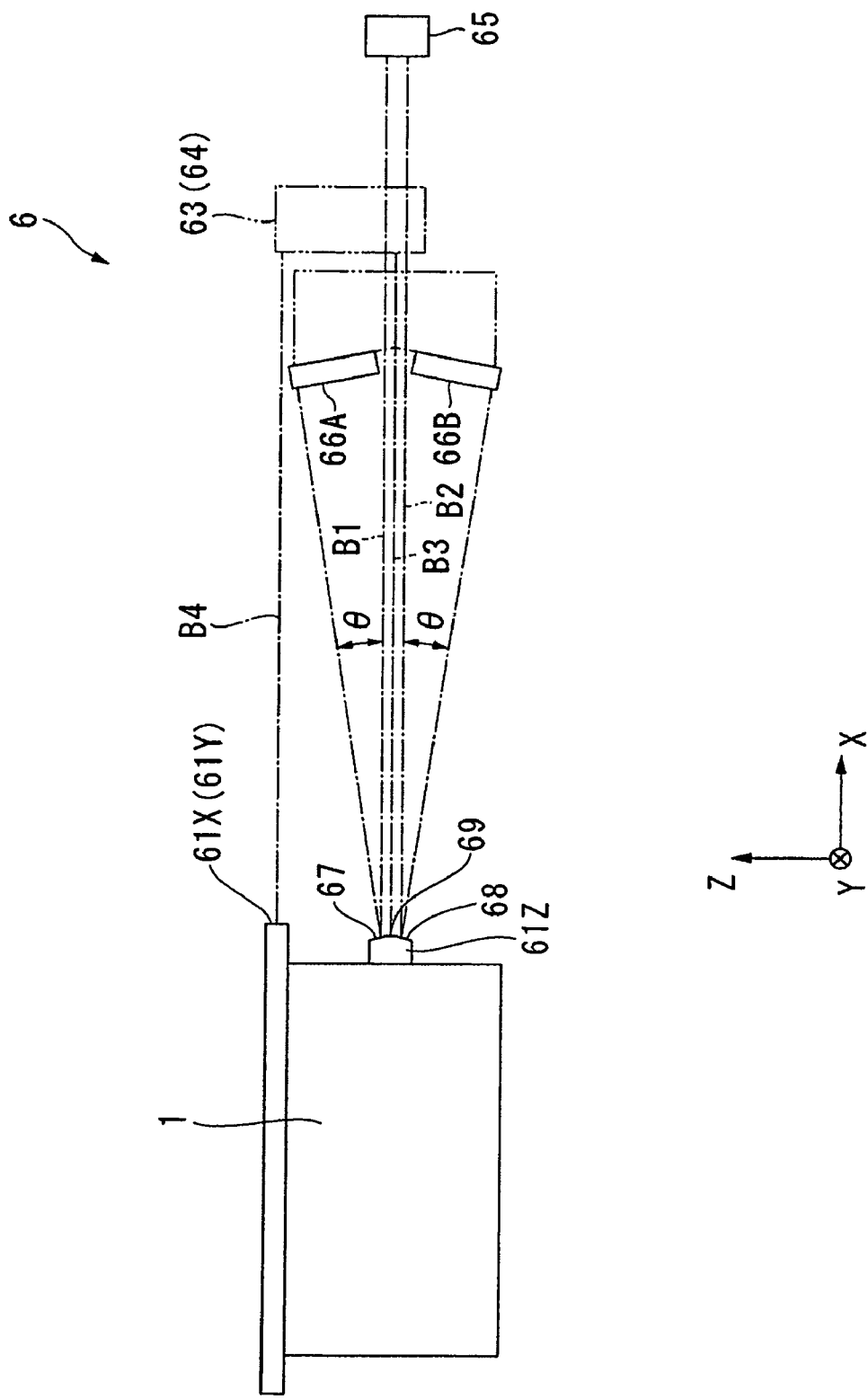
FIG. 6 is a diagram for illustrating a measurement system according to the first embodiment.
Figure 7:
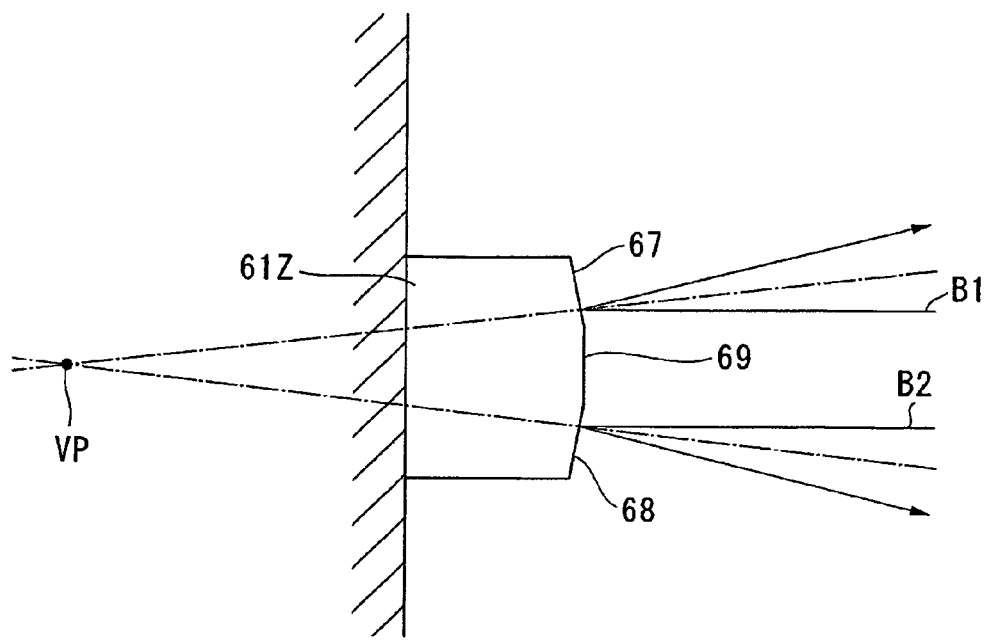
FIG. 7 is a diagram for illustrating a measurement system according to the first embodiment.
Figure 7:
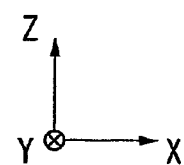

As shown in FIG. 6 and FIG. 7, the measuring mirror 61Z has a first reflecting surface 67 including a Z-axial-direction component; a second reflecting surface 68 which includes a Z-axial-direction component and is substantially symmetrical to the first reflecting surface 67; and a third reflecting surface 69 substantially orthogonal to the X axial direction (or Y axial direction). The measuring mirror 62Z has a similar shape to that of the measuring mirror 61Z.

Measurement operation in the case where the reflecting mirror 61Z provided on the +X-side surface of the first substrate stage 1 is used will now be described with reference to FIG. 6 and FIG. 7. This description also applies to measurement operation in the case where the reflecting mirrors 61Z provided on the −X-side, −Y-side, and +Y-side surfaces of the first substrate stage 1 are used and measurement operation in the case where the reflecting mirrors 62Z provided on the second substrate stage 2 are used.

Referring to FIG. 6 and FIG. 7, the measurement system 6 includes the Z interferometer 65; the reflecting mirror 61Z provided on the first substrate stage 1; and fixed mirrors 66A and 66B disposed at locations opposing the reflecting mirror 61Z. In this embodiment, at least two Z interferometers 65 are provided in the Y axial direction so that measurement for the substrate stage 1 or the substrate stage 2 can be performed simultaneously at two different points.

The reflecting mirror 61Z has the first, second, and third reflecting surfaces 67, 68, and 69. The lengths of the first, second, and third reflecting surfaces 67, 68, and 69 in the Y axial direction are larger than the length of the reflecting mirror 61X in the Y axial direction.

The first reflecting surface 67 is parallel to a plane resulting from the YZ plane being tilted by a predetermined angle in the θY direction and includes a Z-axial-direction component. The second reflecting surface 68 is substantially symmetrical to the first reflecting surface 67 about a plane parallel to the XY plane and includes a Z-axial-direction component. The third reflecting surface 69 is parallel to the YZ plane and is disposed between the first reflecting surface 67 and the second reflecting surface 68.

The Z interferometer 65 emits a measuring beam B1, which is substantially parallel to the X axial direction, onto the first reflecting surface 67, emits a measuring beam B2, which is substantially parallel to the X axial direction, onto the second reflecting surface 68, and measures the position of the first substrate stage 1 in the Z axial direction by receiving the measuring beams B1 and B2 reflected at the first and second reflecting surfaces 67 and 68.

The fixed mirror 66A is optically coupled with the first reflecting surface 67 of the measuring mirror 61Z and has a reflecting surface disposed so as to be orthogonal to the measuring beam B1 that is incident upon the fixed mirror 66A from the first reflecting surface 67. The reflecting surface of the fixed mirror 66A is angled with respect to the YZ plane. The reflecting surface of the fixed mirror 66A reflects, towards the first reflecting surface 67, the measuring beam B1 that has been incident upon the fixed mirror 66A from the first reflecting surface 67. Similarly, the fixed mirror 66B is optically coupled with the second reflecting surface 68 of the measuring mirror 61Z and has a reflecting surface disposed so as to be orthogonal to the measuring beam B2 that is incident upon the fixed mirror 66B from the second reflecting surface 68. The reflecting surface of the fixed mirror 66B is angled with respect to the YZ plane. The reflecting surface of the fixed mirror 66B reflects, towards the second reflecting surface 68, the measuring beam B2 that has been incident upon the fixed mirror 66B from the second reflecting surface 68.

The X interferometer 63 emits a measuring beam B4 onto the measuring mirror 61X and receives the reflected beam to measure the position of the first substrate stage 1 in the X axial direction. Furthermore, the X interferometer 63 emits a measuring beam B3 substantially parallel to the X axial direction onto the third reflecting surface 69 and receives the measuring beam B3 reflected at the third reflecting surface 69 to measure the position of the measuring mirror 61Z (the first substrate stage 1) in the X axial direction. The measuring beam B3 and the measuring beam B4 are separated by a predetermined distance with respect to the Z axial direction. Furthermore, the X interferometer 63 can measure the displacement (amount of pitching) of the first substrate stage 1 in the θY direction based on the position, in the X axial direction, of each of the reflecting surface of the measuring mirror 61X and the third reflecting surface 69 of the measuring mirror 61Z.

When the measuring mirror 61Z is illuminated with the measuring beams B1 and B2 from the Z interferometer 65, the measuring beams B1 and B2 are reflected at the first and second reflecting surfaces 67 and 68 at an angle θ with respect to the incident beam. The measuring beams B1 and B2 reflected at the first and second reflecting surfaces 67 and 68 are incident upon the fixed mirrors 66A and 66B, reflected at the reflecting surfaces of the fixed mirrors 66A and 66B, and received by the Z interferometer 65 via the first and second reflecting surfaces 67 and 68 of the measuring mirror 61Z.

If the displacement of the first substrate stage 1 (the measuring mirror 61Z) in the X axial direction is ΔXo and the displacement of the first substrate stage 1 in the Z axial direction is ΔZo, then a change ΔL1 in the optical path length of the measuring beam B1 and a change ΔL2 in the optical path length of the measuring beam B2 that are received at the Z interferometer 65 are represented using the following formulas, respectively.

$$\Delta L1 \approx \Delta Xo \times \cos\theta - \Delta Zo \times \sin\theta \quad (1)$$

$$\Delta L2 \approx \Delta Xo \times \cos\theta + \Delta Zo \times \sin\theta \quad (2)$$

Therefore, ΔZo and ΔXo are obtained using the following formulas based on Formulas (1) and (2).

$$\Delta Zo = (\Delta L2 - \Delta L1)/2\sin\theta \quad (3)$$

$$\Delta Xo = (\Delta L1 + \Delta L2)/2\cos\theta \quad (4)$$

At this time, the obtained displacements ΔZo and ΔXo represent displacements as measured at a measurement point VP which is an intersection point of the normals at the points of intersection between the measuring beams B1 and B2 and the first and second reflecting surfaces 67 and 68, as shown in FIG. 7.

As described above, at least two Z interferometers 65 are provided in the Y axial direction so that measurement for the substrate stage 1 or the substrate stage 2 can be performed at two different points. The above-described displacements ΔZo and ΔXo are obtained with each of the two Z interferometers 65. If the displacements obtained with one of the Z interferometers 65 are ΔZoL and ΔXoL, the displacements obtained with the other Z interferometer 65 are ΔZoR and ΔXoR, and the distance, in the Y axial direction, of the measuring beams B1 and B2 emitted by the Z interferometers 65 is D, then the displacement (amount of yawing) ΔθZ of the measuring mirror 61Z (the first substrate stage 1) in the θZ direction and the displacement (amount of rolling) ΔθX of the measuring mirror 61Z (the first substrate stage 1) in the θX direction are obtained by the following formulas.

$$\Delta\theta Z = (\Delta XoR - \Delta XoL)/D \quad (5)$$

$$\Delta\theta X = (\Delta ZoL - \Delta ZoR)/D \quad (6)$$

In this manner, the control apparatus 7 can obtain the displacements of the first substrate stage 1 in a direction of four degrees of freedom of ΔZo, ΔXo, ΔθZ, and ΔθX, based on the measurement results of the Z interferometers 65 and 65.

In addition, as described above, the control apparatus 7 can obtain the displacement (amount of pitching) ΔθY of the first substrate stage 1 in the θY direction based on the measurement result by the X interferometer 63 using the measuring beams B3 and B4, that is, based on the displacement, in the X axial direction, of the reflecting surface of the measuring mirror 61X and the displacement, in the X axial direction, of the third reflecting surface 69 of the measuring mirror 61Z.

Furthermore, the control apparatus 7 can obtain the displacement ΔY of the first substrate stage 1 in the Y axial direction based on the measurement result of the Y interferometer 64.

In this manner, the control apparatus 7 can measure positional information about a direction of six degrees of freedom of the X axis, Y axis, Z axis, θX, θY, and θZ directions of the first substrate stage 1 using the measurement system 6. Similarly, the control apparatus 7 can measure positional information about a direction of six degrees of freedom of the second substrate stage 2 using the measurement system 6.

In this embodiment, each of the first and second substrate stages 1 and 2 is substantially rectangular in the XY plane. The first substrate stage 1 has four end faces around the substrate P held by the first substrate stage 1. The second substrate stage 2 has four end faces around the substrate P held by the second substrate stage 2. The measuring mirrors 61X, 61Y, 62X, and 62Y are disposed on each of these end faces. In this embodiment, each end face of the first substrate stage 1 and the second substrate stage 2 projects (overhangs) outward beyond the measuring mirror 61Z.

Furthermore, the measurement system 6 has the alignment system 9 including the above-described second optical element 12. The alignment system 9 is disposed in the measurement station ST2 and can detect an alignment mark on the substrate P or the reference marks on the upper surfaces 1T and 2T of the first and second substrate stages 1 and 2.

In addition, the measurement system 6 has the above-described focus leveling detection system. The focus leveling detection system is disposed in the measurement station ST2 and detects surface-position information (surface-position information about the Z axis, θX, and θY directions) of the surfaces of the substrates P supported by the first and second substrate stages 1 and 2. In the measurement station ST2, the focus leveling detection system alternately detects surface-position information about the surface of the substrate P supported by the first substrate stage 1 and surface-position information about the surface of the substrate P supported by the second substrate stage 2.

Based on the measurement result of the measurement system 6, the control apparatus 7 controls the positions of the substrates P supported by the first and second substrate stages 1 and 2 by driving the substrate-stage driving system 5 to control the positions of the first and second substrate stages 1 and 2.

Next, one example of the operation of the exposure apparatus with the above-described structure is described with reference to the schematic diagrams of FIG. 8 to FIG. 13 and the perspective view of FIG. 14.

In this embodiment, the exposure apparatus EX simultaneously performs the operation of setting one of the first substrate stage 1 and the second substrate stage 2 at the first position, which opposes the first optical element 8 disposed in the exposure station ST1, to expose the substrate P held on the one substrate stage and at least part of the operation of setting the other substrate stage at the second position, which opposes the second optical element 12 disposed in the measurement station ST2, to measure the substrate P held on the other substrate stage.

More specifically, in a state where the optical path space of the exposure light EL is filled with the liquid LQ, the control apparatus 7 exposes the substrate P held on the first substrate stage 1 or the second substrate stage 2, whichever exists in the exposure station ST1, via the projection optical system PL and the liquid LQ while controlling the movement of that substrate stage. On the other hand, the control apparatus 7 measures positional information about the non-exposed substrate P held on the other substrate stage which exists in the measurement station ST2. Here, positional information about the substrate P includes at least one of the surface-position information (positional information in the Z, θX, and θY directions) about the substrate P with respect to a predetermined reference surface and the alignment information (positional information in the X, Y, and θZ directions of a plurality of shot regions on the substrate P) about the substrate P with respect to a predetermined reference position.

The control apparatus 7 starts exchanging (loading and/or unloading) the substrate P and predetermined measurement processing in the measurement station ST2. For example, the control apparatus 7 sets the second substrate stage 2 at the substrate exchange position of the measurement station ST2 to load the substrate P that is to be subjected to exposure processing onto the second substrate stage 2 using the transfer system H. Then, in the measurement station ST2, the control apparatus 7 starts measurement processing related to the second substrate stage 2 holding the substrate P. On the other hand, the first substrate stage 1 holding the substrate P which has already been loaded is disposed in the exposure station ST1. Thus, exposure of the substrate P that has been subjected to measurement processing in the measurement station ST2 is started.

Figure 8:
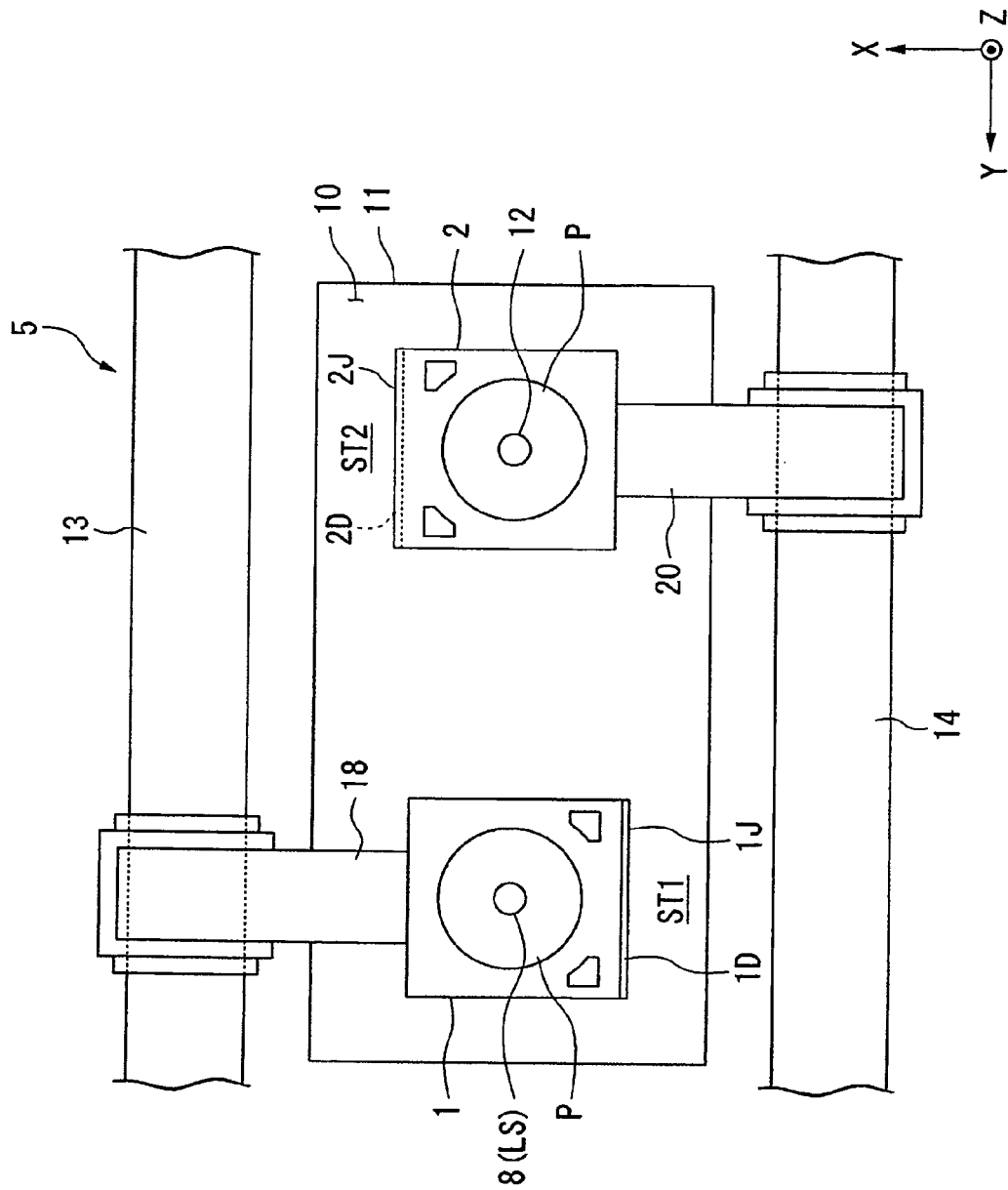
FIG. 8 is a schematic diagram for illustrating an exposure method according to the first embodiment.

As shown in FIG. 8, in the exposure station ST1, the control apparatus 7 moves the first substrate stage 1 to the first position, which opposes the first optical element 8, using the substrate-stage driving system 5 to carry out exposure processing of the substrate P held on the first substrate stage 1. Furthermore, in the measurement station ST2, the control apparatus 7 moves the second substrate stage 2 to the second position, which opposes the second optical element 12, using the substrate-stage driving system 5 to carry out measurement processing of the substrate P held on the second substrate stage 2 in parallel with at least part of the exposure processing of the substrate P held on the first substrate stage 1.

In the exposure station ST1, the control apparatus 7 carries out immersion exposure of the substrate P held on the first substrate stage 1. While the first substrate stage 1 holding the substrate P is made to oppose the first optical element 8 of the projection optical system PL and the optical path space of the exposure light EL on the light-exit side of the first optical element 8 is filled with the liquid LQ, the control apparatus 7 exposes the substrate P.

While exposure processing is being performed using the first substrate stage 1 in the exposure station ST1, processing such as measurement processing using the second substrate stage 2 is carried out in the measurement station ST2. In this embodiment, measurement operations in the measurement station ST2 include a detection operation using the above-described alignment system 9 and a detection operation using the focus leveling detection system.

For example, for a detection operation using the focus leveling detection system, the control apparatus 7 detects surface-position information about a predetermined reference surface and the surface of the substrate P using the focus leveling detection system without achieving an immersed state in the measurement station ST2, while measuring positional information about the second substrate stage 2 in the Z axial direction using the Z interferometer 65. Thereafter, the control apparatus 7 obtains an approximated plane (approximated surface) of each shot region on the surface of the substrate P with respect to the reference surface.

Furthermore, for a detection operation using the alignment system 9, the control apparatus 7 detects a reference mark formed on part of the second substrate stage 2 and an alignment mark provided on the substrate P so as to correspond to each shot region on the substrate P using the alignment system while measuring positional information, in the X axial direction and Y axial direction, of the second substrate stage 2 holding the substrate P with the X interferometer 63 and the Y interferometer 64 in the measurement station ST2. Then, the control apparatus 7 obtains positional information about each of the plurality of shot regions on the substrate P with respect to the predetermined reference position by arithmetic operations.

After exposure processing of the substrate P held on the first substrate stage 1 is completed in the exposure station ST1 and measurement processing of the substrate P held on the second substrate stage 2 is completed in the measurement station ST2, the control apparatus 7 starts to move the second substrate stage 2 from the measurement station ST2 to the exposure station ST1.

Figure 9:
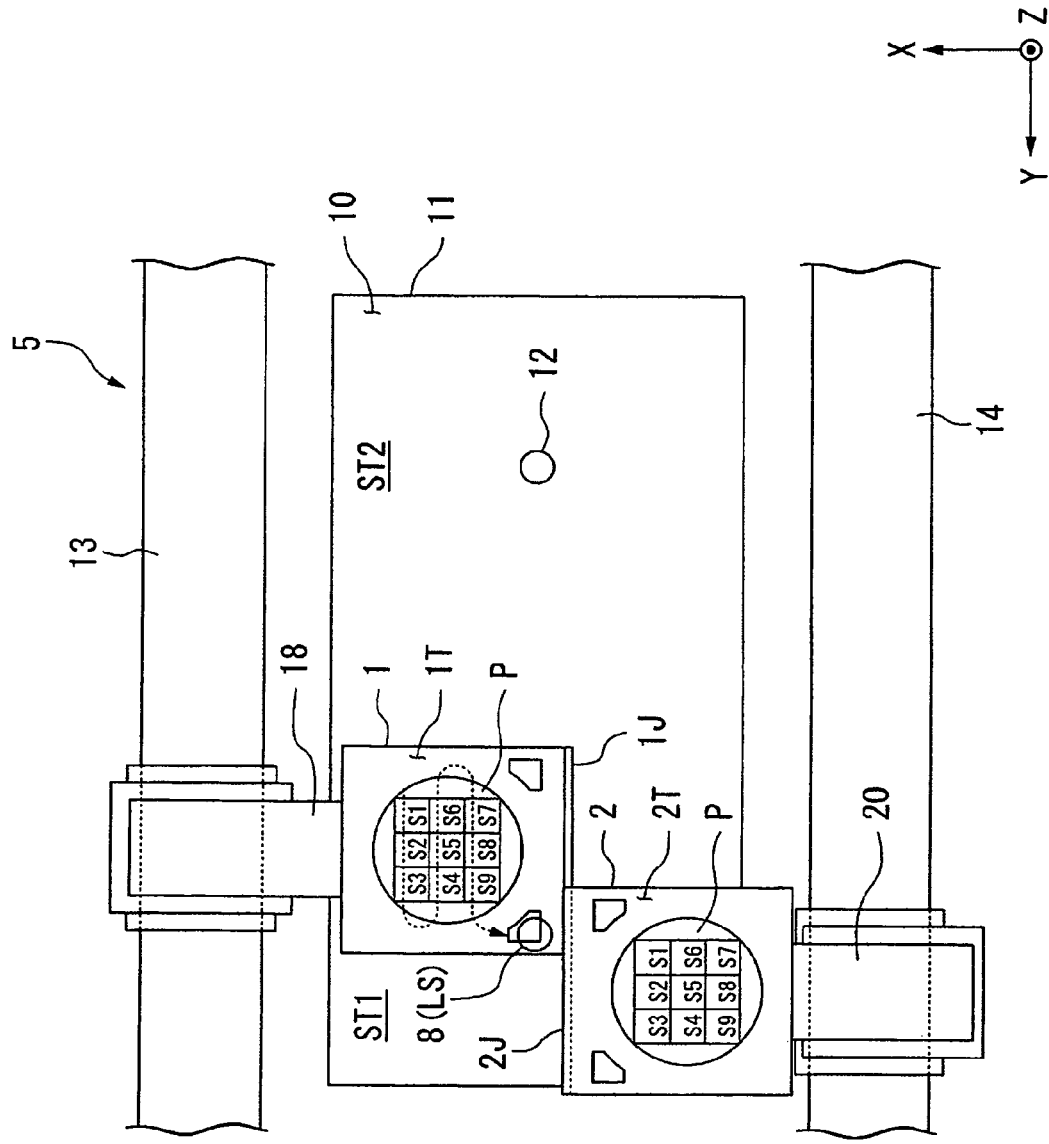
FIG. 9 is a schematic diagram for illustrating an exposure method according to the first embodiment.

In this embodiment, the control apparatus 7 sets the first substrate stage 1 at the first position, which opposes the first optical element 8, even while moving the second substrate stage 2 from the measurement station ST2 to the exposure station ST1. By doing so, the liquid LQ in the immersion space LS remains held between the first optical element 8 and the first substrate stage 1 (the substrate P) also while the second substrate stage 2 is moving from the measurement station ST2 to the exposure station ST1. Thereafter, the control apparatus 7 moves the second substrate stage 2 to the exposure station ST1 and, as shown in FIG. 9 and FIG. 14, sets both the first substrate stage 1 and the second substrate stage 2 in the exposure station ST1.

In this embodiment, the control apparatus 7 moves each of the first substrate stage 1 and the second substrate stage 2 using the substrate-stage driving system 5 so that the second substrate stage 2 is positioned adjacent to the −X side of the first substrate stage 1. The first substrate stage 1 and the second substrate stage 2 are positioned such that the first opposing surface 1J opposes the second opposing surface 2J.

Next, in order to subject the substrate P on the second substrate stage 2 to immersion exposure, the control apparatus 7 changes the state where the first substrate stage 1 opposes the first optical element 8 (the liquid LQ is held between the first substrate stage 1 and the first optical element 8) to a state where the second substrate stage 2 opposes the first optical element 8 (the liquid LQ is held between the second substrate stage 2 and the first optical element 8).

In this embodiment, as disclosed in, for example, PCT International Publication No. WO 2005/074014, the control apparatus 7 synchronously moves the first substrate stage 1 and the second substrate stage 2 in the X axial direction with respect to the first optical element 8 by using the substrate-stage driving system 5 in a predetermined area of the guide surface 10 including the first position, which opposes the first optical element 8, in a state where the upper surface 1T of the first substrate stage 1 is close to or in contact with the upper surface 2T of the second substrate stage 2 such that the first substrate stage 1 and the second substrate stage 2 continue to form a space where the liquid LQ can be held with the first optical element 8.

In this embodiment, the substrate-stage driving system 5 moves the first substrate stage 1 and the second substrate stage 2 in the X axial direction of the guide surface 10 including the first position, which opposes the first optical element 8, while the first substrate stage 1 is close to or in contact with the second substrate stage 2 in a state where the positions of the first substrate stage 1 and the second substrate stage 2 with respect to the Y axial direction are shifted (biased). In other words, when the control apparatus 7 uses the substrate-stage driving system 5 to synchronously move the first substrate stage 1 and the second substrate stage 2 in the X axial direction in a predetermined area of the guide surface 10 including the first position while the first substrate stage 1 is close to or in contact with the second substrate stage 2, the control apparatus 7 causes the positions of the first substrate stage 1 and the second substrate stage 2 to be shifted with respect to the Y axial direction. That is, the first substrate stage 1 and the second substrate stage 2 move in the X axial direction, in a state in which the first substrate stage 1 and the second substrate stage 2 are close to or in contact with each other and in which the positions of the first substrate stage 1 and the second substrate stage 2 in the Y axial direction are shifted (out of aligned relation) with each other.

Here, "to shift" includes to shift the position (center position) of the first substrate stage 1 and the position (center position) of the second substrate stage 2 with respect to a predetermined reference position (e.g., position where the first optical element 8 is disposed). However, positions compared with a reference position are not limited to the center position of each stage.

A plurality of shot regions S1 to S9 is set on the substrate P, and the plurality of shot regions S1 to S9 are exposed to light sequentially. In this embodiment, the control apparatus 7 performs the synchronous movement using the substrate-stage driving system 5 such that part of an end face (the first opposing surface 1J) of the first substrate stage 1, i.e., the end face adjacent to the shot region S9, which was exposed last, on the substrate P held by the first substrate stage 1 is close to or in contact with part of an end face (the second opposing surface 2J) of the second substrate stage 2, i.e., the end face adjacent to the shot region S1, which is to be exposed first, on the substrate P held by the second substrate stage 2.

In this embodiment, the shot region S9, which was exposed last, on the substrate P held by the first substrate stage 1 is disposed near the −X-side, +Y-side corner on the upper surface 1T of the first substrate stage 1, whereas the shot region S1, which is to be exposed first, on the substrate P held by the second substrate stage 2 is disposed near the +X-side, −Y-side corner on the upper surface 2T of the second substrate stage 2.

Therefore, in this embodiment, the control apparatus 7 controls the substrate-stage driving system 5 to shift (bias) the second substrate stage 2 holding the non-exposed substrate P to the +Y side (away from the measurement station ST2) with respect to the first substrate stage 1 holding the exposed substrate P and synchronously moves the first substrate stage 1 and the second substrate stage 2 in the X axial direction such that a +Y-side part on the −X-side end-face (the first opposing surface 1J) of the first substrate stage 1 is close to or in contact with a −Y-side part on the +X-side end-face (the second opposing surface 2J) of the second substrate stage 2.

In other words, after the exposure of the substrate P held on the first substrate stage 1 is completed and before exposure of the substrate P held on the second substrate stage 2 is started, when the control apparatus 7 performs synchronous movement in the X axial direction using the substrate-stage driving system 5 such that the first substrate stage 1 is close to or in contact with the second substrate stage 2, the control apparatus 7 performs this synchronous movement in the X axial direction (in the +X direction) while the first substrate stage 1 is close to or in contact with the second substrate stage 2 and the first substrate stage 1 is set at a position closer to the second optical element 12 (the measurement station ST2) than the second substrate stage 2.

Figure 10:
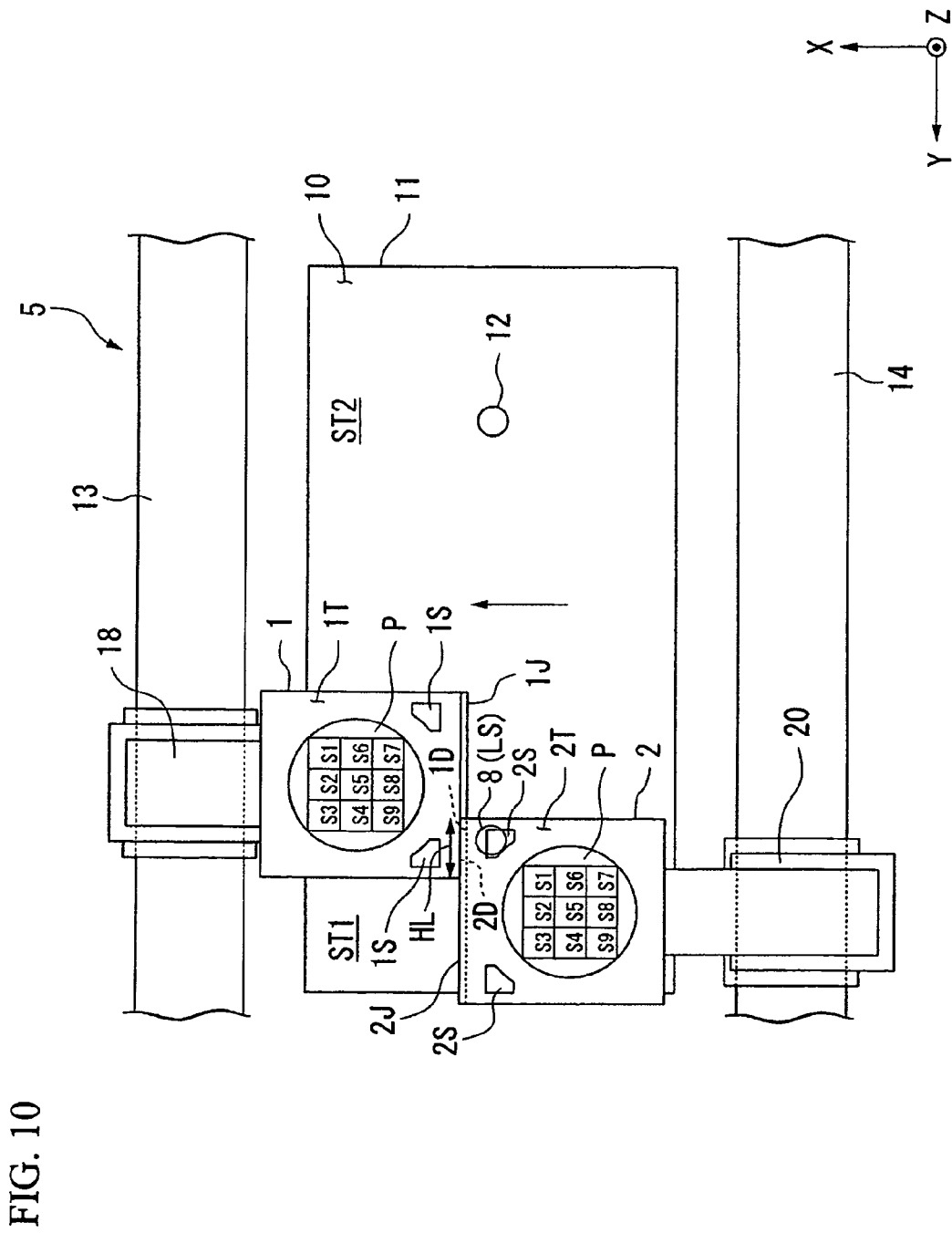
FIG. 10 is a schematic diagram for illustrating an exposure method according to the first embodiment.

By doing so, the control apparatus 7 can change the state where the first substrate stage 1 opposes the first optical element 8 and the liquid LQ is held between the first substrate stage 1 and the first optical element 8) to a state where the second substrate stage 2 opposes the first optical element 8 and the liquid LQ is held between the second substrate stage 2 and the first optical element 8, as shown in FIG. 10.

The liquid LQ (the immersion space LS) held between the second substrate stage 2 and the first optical element 8 is set adjacent to the shot region S1, which is to be exposed first, on the substrate P held on the second substrate stage 2. Therefore, exposure of the substrate P held on the second substrate stage 2 can be started immediately after exposure of the substrate P held on the first substrate stage 1 is completed.

Before exposure of the substrate P held on the second substrate stage 2 is started, measurement of the exposure light EL can be performed using the measurement region 2S disposed on the upper surface 2T of the second substrate stage 2. In this embodiment, on the upper surface 2T of the second substrate stage 2, the measurement region 2S is disposed in an area adjacent to the shot region S1 (in the +X-side, −Y-side corner), which is to be exposed first, on the substrate P held on the second substrate stage 2. Therefore, also when measurement of the exposure light EL is to be performed using the measurement region 2S, the state where the first substrate stage 1 opposes the first optical element 8 (the liquid LQ is held between the first substrate stage 1 and the first optical element 8) can be switched to a state where the first optical element 8 opposes the measurement region 2S of the second substrate stage 2 (the liquid LQ is held between the first optical element 8 and the measurement region 2S) immediately after the exposure of the substrate P held on the first substrate stage 1 is completed.

As described above, in this embodiment, the first and second substrate stages 1 and 2 are provided with the measuring mirrors 61Z and 62Z for measuring the positions of the first and second substrate stages 1 and 2 in the Z axial direction, and each of the first and second substrate stages 2 has an end face that projects outward beyond the measuring mirrors 61Z and 62Z. The substrate-stage driving system 5 synchronously moves the first substrate stage 1 and the second substrate stage 2 in the X axial direction such that part of the −X-side end-face (the first opposing surface 1J) of the first substrate stage 1 that projects outward beyond the measuring mirror 61Z is close to or in contact with part of the +X-side end-face (the second opposing surface 2J) of the second substrate stage 2 that projects outward beyond the measuring mirror 62Z. By doing so, the upper surface 1T of the first substrate stage 1 can be brought close to or into contact with at least part of the upper surface 2T of the second substrate stage 2 while still preventing, for example, the measuring mirror 61Z from coming into contact with part of the second substrate stage 2 or the measuring mirror 62Z from coming into contact with part of the first substrate stage 1. Therefore, while maintaining the immersion space LS of the liquid LQ and preventing the liquid LQ from leaking, the exposure apparatus EX can smoothly change the state where the liquid LQ is held between the first substrate stage 1 and the first optical element 8 to a state where the liquid LQ is held between the second substrate stage 2 and the first optical element 8. In short, the exposure apparatus EX can change the state where the first substrate stage 1 opposes the first optical element 8 to a state where the second substrate stage 2 opposes the first optical element 8 while keeping the optical path space of the exposure light EL on the light-exit side of the first optical element 8 being filled with the liquid LQ.

Furthermore, in this embodiment, the step 1D is formed on the first opposing surface 1J of the first substrate stage 1, and the step 2D, which is fitted with the step 1D of the first substrate stage 1, is formed on the second opposing surface 2J of the second substrate stage 2. Therefore, while maintaining the immersion space LS of the liquid LQ and preventing the liquid LQ from leaking, the exposure apparatus EX can smoothly change the state where the liquid LQ is held between the first substrate stage 1 and the first optical element 8 to a state where the liquid LQ is held between the second substrate stage 2 and the first optical element 8.

Furthermore, a width HL (refer to FIG. 10) of shift with respect to the Y axial direction while the first substrate stage 1 is close to or in contact with the second substrate stage 2 has a minimum possible value to allow at least one of the first substrate stage 1 and the second substrate stage 2 to hold the liquid LQ between itself and the first optical element 8 (the nozzle member 30). More specifically, the positional relationship between the first substrate stage 1 and the second substrate stage 2 is adjusted so that the width HL of shift with respect to the Y axial direction while the first opposing surface 1J of the first substrate stage 1 is close to or in contact with the second opposing surface 2J of the second substrate stage 2 is slightly larger than the maximum width of the immersion space LS in the XY plane with respect to the Y axial direction. By doing so, while maintaining the immersion space LS of the liquid LQ and preventing the liquid LQ from leaking, the exposure apparatus EX can smoothly change the state where the liquid LQ is held between the first substrate stage 1 and the first optical element 8 (the nozzle member 30) to a state where the liquid LQ is held between the second substrate stage 2 and the first optical element 8 (the nozzle member 30). It is noted that the width HL can be set irrespective of the width of the immersion space LS. Furthermore, as described above, "to shift" includes to shift the position (center position) of the first substrate stage 1 and the position (center position) of the second substrate stage 2 with respect to a predetermined reference position (e.g., position where the first optical element 8 is disposed). For example, the positions of both the substrate stages 1 and 2 may be shifted more than the radius of the substrate P, and the shift value (amount of shift) itself may be slight as long as the minimum width HL can be achieved. The shift value may be set as appropriate in consideration of the period of time from when exposure of the substrate P on the first substrate stage 1 is completed to when exposure of the substrate P on the second substrate stage 2 is started (whether exposure can be started quickly) or mechanical restrictions upon the first and second substrate stages 1 and 2.

After the state where the liquid LQ is held between the first substrate stage 1 and the first optical element 8 (the nozzle member 30) has been switched to a state where the liquid LQ is held between the second substrate stage 2 and the first optical element 8 (the nozzle member 30), the control apparatus 7 controls the substrate-stage driving system 5 to move the first substrate stage 1 to the measurement station ST2 while keeping the second substrate stage 2 being opposed to the first optical element 8.

Figure 11:
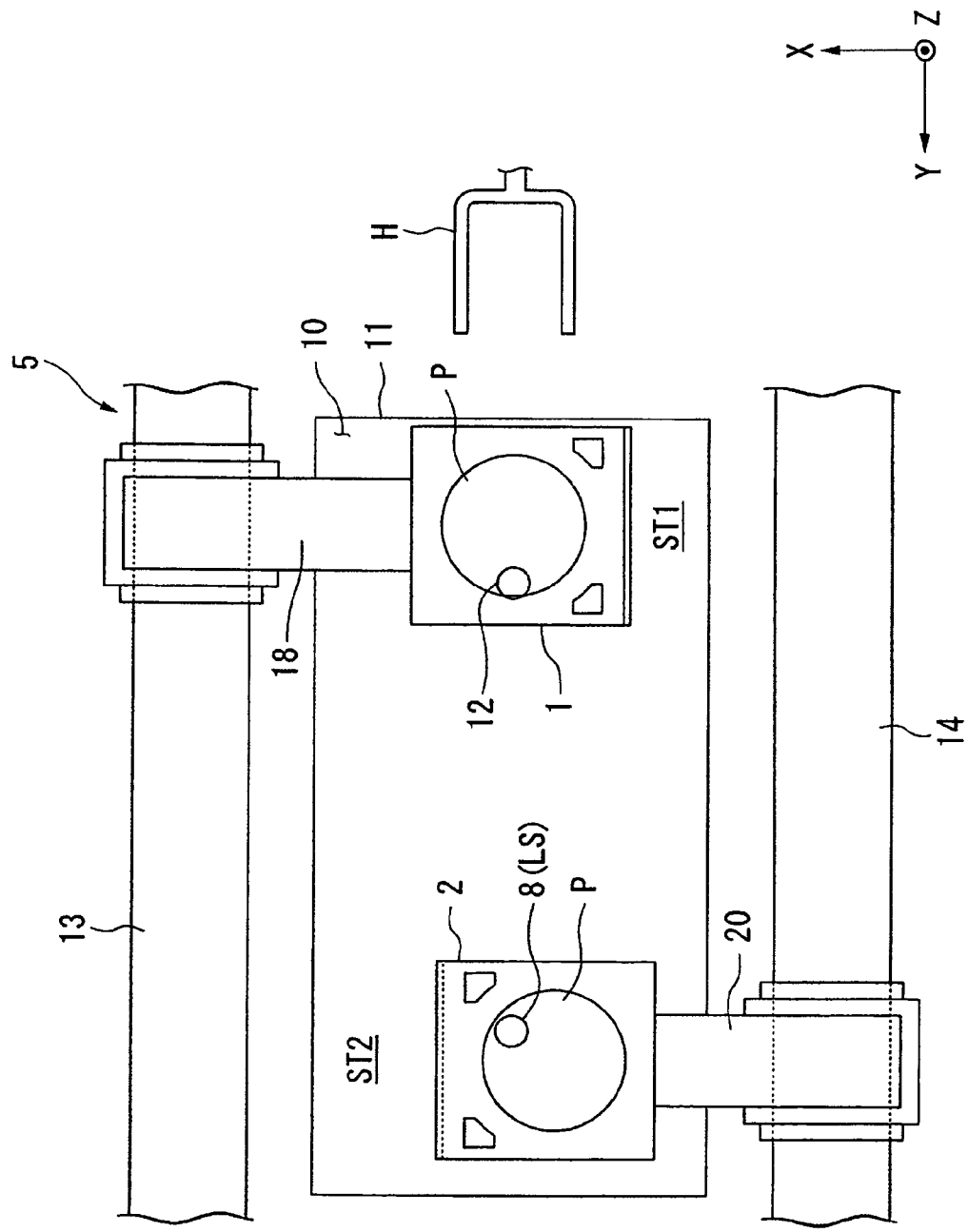
FIG. 11 is a schematic diagram for illustrating an exposure method according to the first embodiment.

Then, as shown in FIG. 11, the second substrate stage 2 is positioned in the exposure station ST1, and furthermore, the first substrate stage 1 is positioned in the measurement station ST2. Thereafter, using the transfer system H, the control apparatus 7 unloads, at the substrate exchange position, the substrate P held on the first substrate stage 1, which has been moved to the measurement station ST2, and then loads a new substrate P to be exposed onto the first substrate stage 1. In the measurement station ST2, the control apparatus 7 starts, for example, measurement processing of the substrate P loaded onto the first substrate stage 1.

While unloading and loading the substrate P from the first substrate stage 1, the control apparatus 7 performs immersion exposure of the substrate P held on the second substrate stage 2 in the exposure station ST1. The control apparatus 7 exposes the substrate P while the second substrate stage 2 holding the substrate P opposes the first optical element 8 and the optical path space of the exposure light EL on the light-exit side of the first optical element 8 is filled with the liquid LQ.

When the substrate P is exposed, the control apparatus 7 exposes the substrate P while adjusting the position of the substrate P held on the second substrate stage 2 in the exposure station ST1 using the measurement result in the measurement station ST2.

After exposure processing of the substrate P held on the second substrate stage 2 is completed in the exposure station ST1 and measurement processing of the substrate P held on the first substrate stage 1 is completed in the measurement station ST2, the control apparatus 7 starts to move the first substrate stage 1 from the measurement station ST2 to the exposure station ST1.

Figure 12:
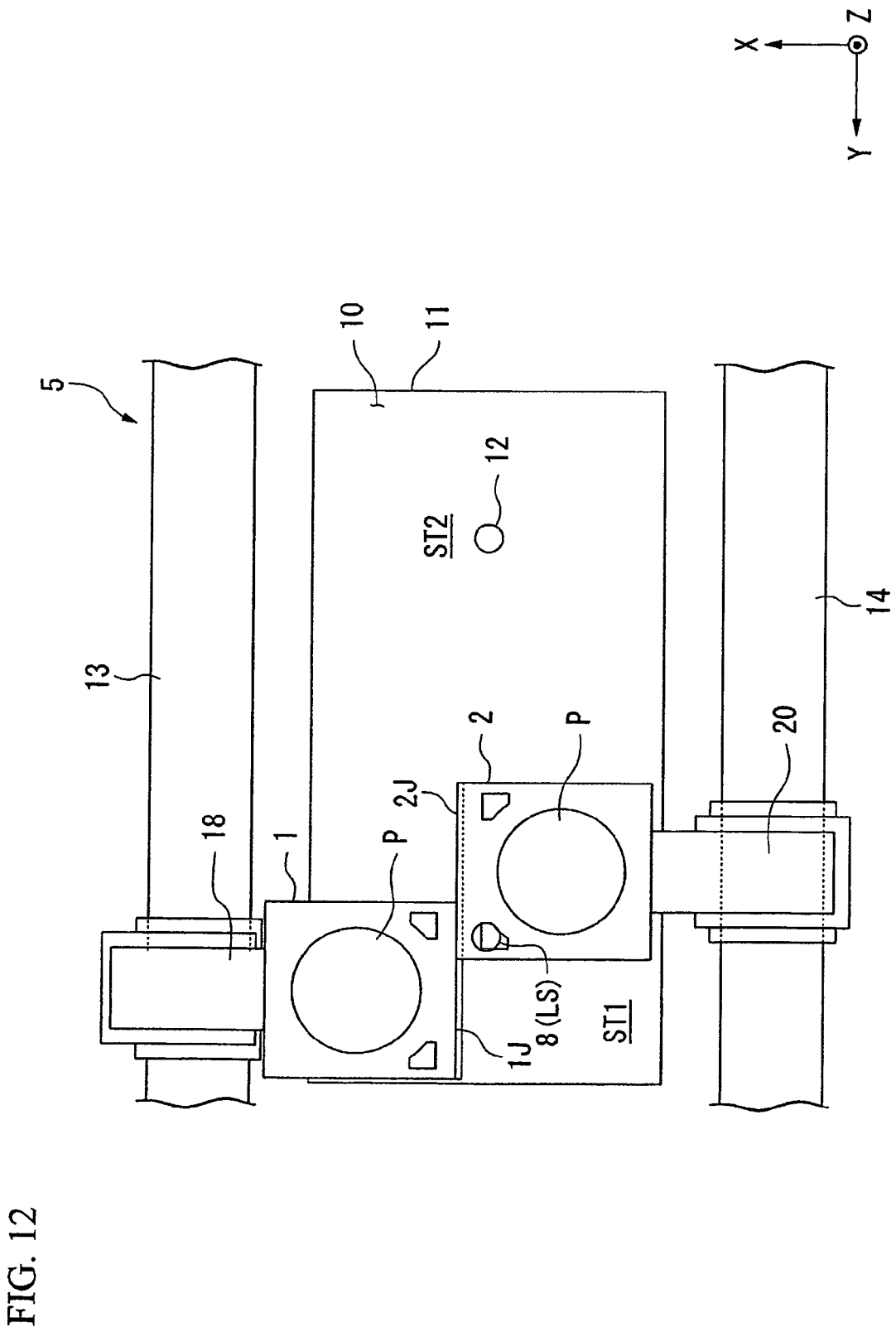
FIG. 12 is a schematic diagram for illustrating an exposure method according to the first embodiment.

Even while the first substrate stage 1 is being moved from the measurement station ST2 to the exposure station ST1, the control apparatus 7 sets the second substrate stage 2 at the first position, which opposes the first optical element 8. Then, the control apparatus 7 moves the first substrate stage 1 to the exposure station ST1 and, as shown in FIG. 12, sets both the first substrate stage 1 and the second substrate stage 2 in the exposure station ST1.

The control apparatus 7 moves each of the first substrate stage 1 and the second substrate stage 2 using the substrate-stage driving system 5 so that the first substrate stage 1 is positioned on the +X side of the second substrate stage 2. The first substrate stage 1 and the second substrate stage 2 are positioned such that the first opposing surface 1J opposes the second opposing surface 2J.

Next, in order to subject the substrate P on the first substrate stage 1 to immersion exposure, the control apparatus 7 changes the state where the second substrate stage 2 opposes the first optical element 8 (the liquid LQ is held between the second substrate stage 2 and the first optical element 8) to a state where the first substrate stage 1 opposes the first optical element 8 (the liquid LQ is held between the first substrate stage 1 and the first optical element 8).

The control apparatus 7 synchronously moves the first substrate stage 1 and the second substrate stage 2 in the X axial direction (−X direction) with respect to the first optical element 8 by using the substrate-stage driving system 5 in a predetermined area of the guide surface 10 including the first position, which opposes the first optical element 8, in a state where the upper surface 1T of the first substrate stage 1 is close to or in contact with the upper surface 2T of the second substrate stage 2 such that the first substrate stage 1 and the second substrate stage 2 continue to form a space where the liquid LQ can be held with the first optical element 8.

Also in this case, the substrate-stage driving system 5 moves the first substrate stage 1 and the second substrate stage 2 in the X axial direction of the guide surface 10 including the first position, which opposes the first optical element 8, while the first substrate stage 1 is close to or in contact with the second substrate stage 2 in a state where the positions of the first substrate stage 1 and the second substrate stage 2 with respect to the Y axial direction are shifted.

The control apparatus 7 sets a positional relationship between the first substrate stage 1 and the second substrate stage 2 according to the position of the shot region, on the second substrate stage 2, that was exposed last on the substrate P held by the second substrate stage 2 and the position of the shot region, on the first substrate stage 1, that is to be exposed first on the substrate P held by the first substrate stage 1.

In this embodiment, after the exposure of the substrate P held on the second substrate stage 2 is completed and before exposure of the substrate P held on the first substrate stage 1 is started, when the control apparatus 7 performs synchronous movement in the X axial direction using the substrate-stage driving system 5 such that the first substrate stage 1 is close to or in contact with the second substrate stage 2, the control apparatus 7 performs this synchronous movement in the X axial direction while the first substrate stage 1 is close to or in contact with the second substrate stage 2 and the second substrate stage 2 is set at a position closer to the second optical element 12 (the measurement station ST2) than the first substrate stage 1.

Figure 13:
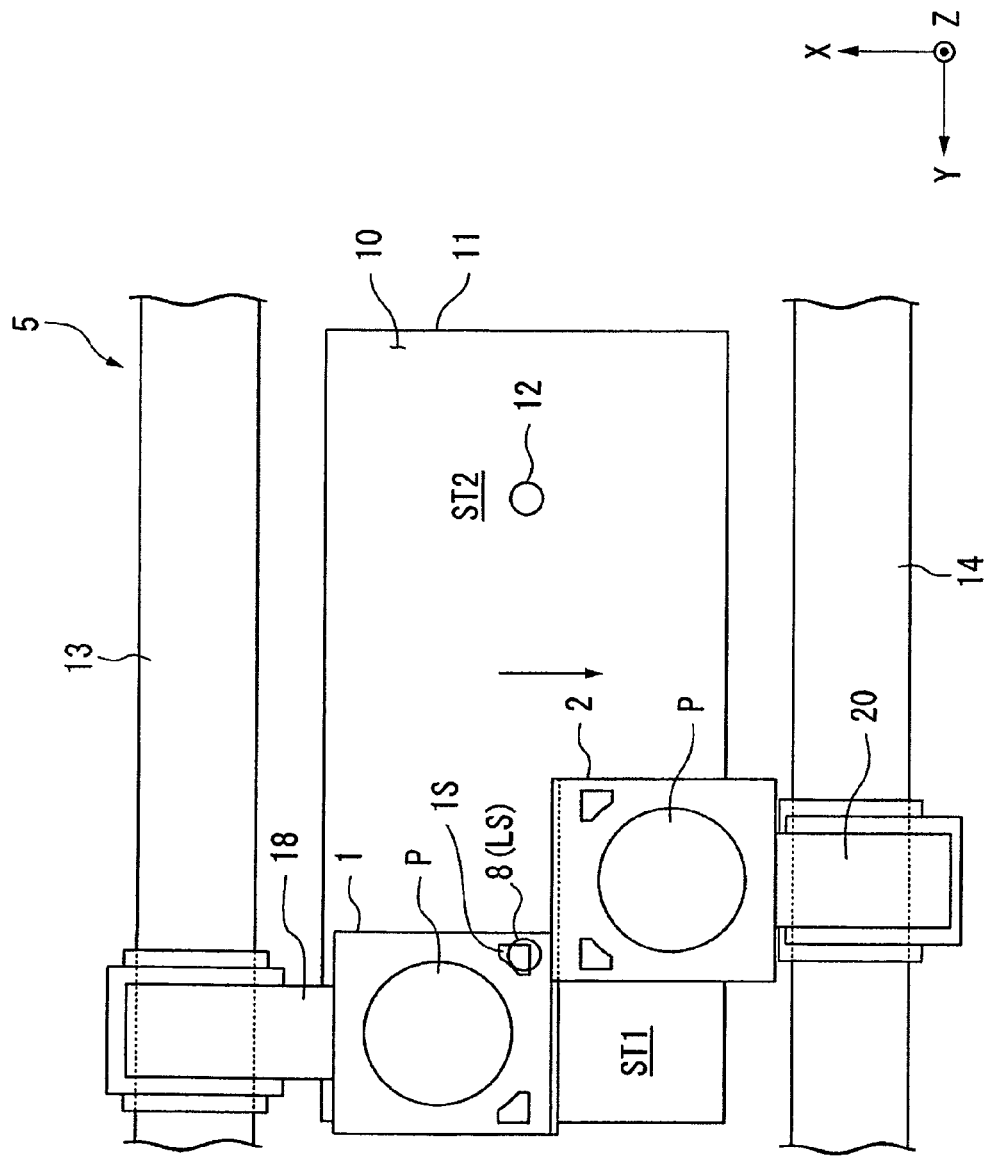
FIG. 13 is a schematic diagram for illustrating an exposure method according to the first embodiment.
Figure 14:
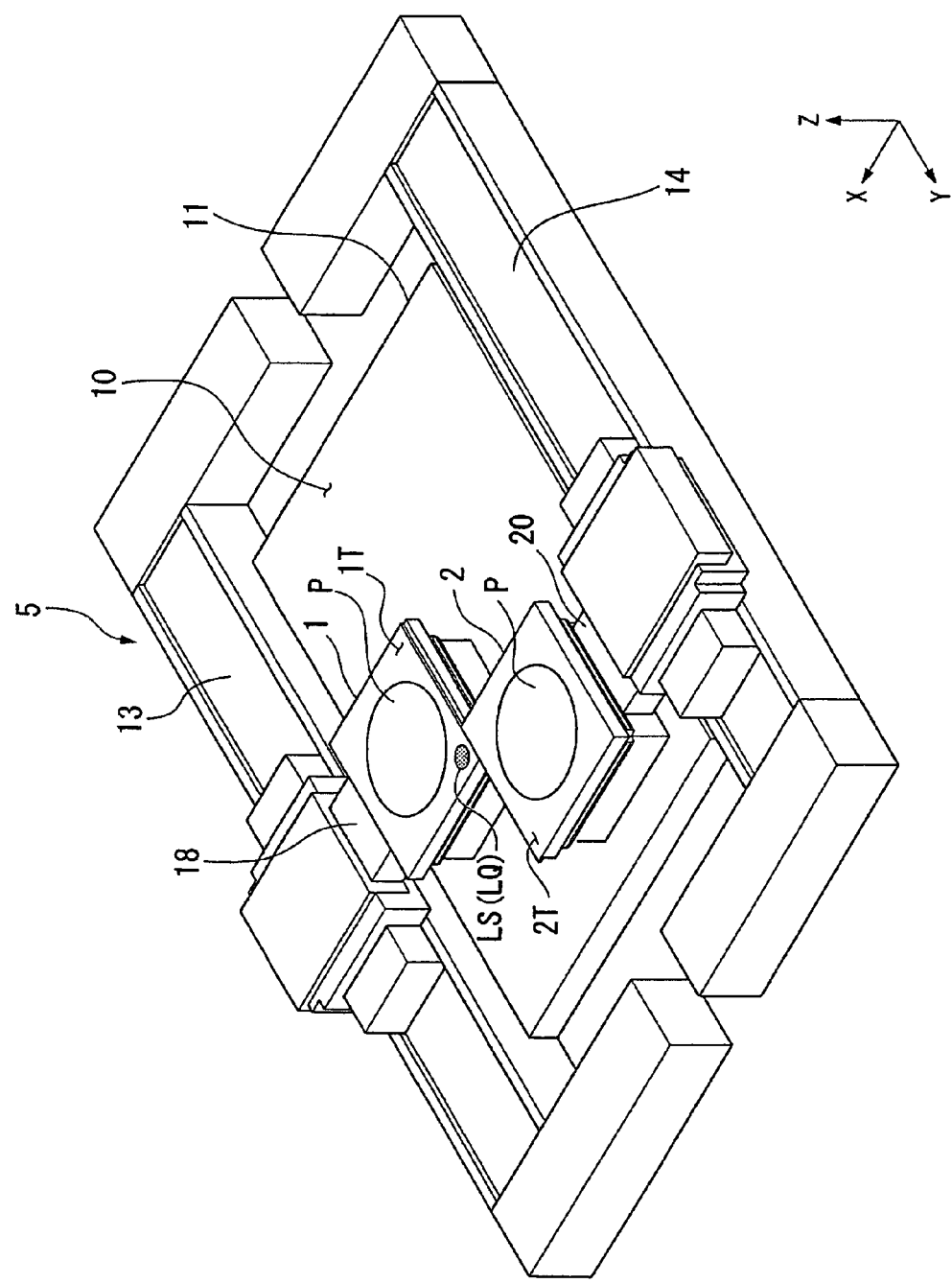
FIG. 14 is a schematic diagram for illustrating an exposure method according to the first embodiment.

By doing so, the control apparatus 7 can change the state where the second substrate stage 2 opposes the first optical element 8 and the liquid LQ is held between the second substrate stage 2 and the first optical element 8 to a state where the first substrate stage 1 opposes the first optical element 8 and the liquid LQ is held between the first substrate stage 1 and the first optical element 8), as shown in FIG. 13.

Before exposure of the substrate P held on the first substrate stage 1 is started, measurement of the exposure light EL can be performed using the measurement region 1S disposed on the upper surface 1T of the first substrate stage 1. In this embodiment, on the upper surface 1T of the first substrate stage 1, the measurement region 1S is disposed in an area adjacent to the shot region that is to be exposed first on the substrate P held by the first substrate stage 1, and measurement of the exposure light EL can be performed using the measurement region 1S.

Also in this case, since the first and second opposing surfaces 1J and 2J of the first and second substrate stages 1 and 2 project outward beyond the measuring mirrors 61Z and 62Z, the exposure apparatus EX can smoothly change the state where the liquid LQ is held between the first substrate stage 1 and the first optical element 8 to a state where the liquid LQ is held between the second substrate stage 2 and the first optical element 8 while preventing the liquid LQ from leaking.

Also in this case, the width HL of shift with respect to the Y axial direction while the first substrate stage 1 is close to or in contact with the second substrate stage 2 has a minimum possible value to allow at least one of the first substrate stage 1 and the second substrate stage 2 to hold the liquid LQ between itself and the first optical element 8 (the nozzle member 30).

After the state where the liquid LQ is held between the second substrate stage 2 and the first optical element 8 (the nozzle member 30) has been switched to a state where the liquid LQ is held between the first substrate stage 1 and the first optical element 8 (the nozzle member 30), the control apparatus 7 controls the substrate-stage driving system 5 to move the second substrate stage 2 to the measurement station ST2 while keeping the first substrate stage 1 being opposed to the first optical element 8.

The first substrate stage 1 is positioned in the exposure station ST1 while the substrate P is being unloaded and loaded from the second substrate stage 2, and furthermore, the second substrate stage 2 is positioned in the measurement station ST2. Thereafter, using the transfer system H, the control apparatus 7 unloads, at the substrate exchange position, the substrate P held on the second substrate stage 2, which has been moved to the measurement station ST2, and then loads a new substrate P to be exposed onto the second substrate stage 2. In the measurement station ST2, the control apparatus 7 starts, for example, measurement processing of the substrate P loaded on the second substrate stage 2.

The control apparatus 7 performs immersion exposure of the substrate P held on the first substrate stage 1 in the exposure station ST1. The control apparatus 7 exposes the substrate P while the first substrate stage 1 holding the substrate P opposes the first optical element 8 and the optical path space of the exposure light EL on the light-exit side of the first optical element 8 is filled with the liquid LQ.

When the substrate P is exposed, the control apparatus 7 exposes the substrate P while adjusting the position of the substrate P held on the first substrate stage 1 in the exposure station ST1 using the measurement result in the measurement station ST2.

Subsequently, the operation described with reference to FIG. 8 to FIG. 14 is repeated.

As described above, according to this embodiment, movement is carried out in the X axial direction of the guide surface 10 including the first position, which opposes the first optical element 8, while the first substrate stage 1 is close to or in contact with the second substrate stage 2 in a state where the positions of the first substrate stage 1 and the second substrate stage 2 with respect to the Y axial direction of the guide surface 10 are shifted. Therefore, for example, the period of time from when exposure of the substrate P held on the first substrate stage 1 (or the second substrate stage 2) is completed to when exposure of the substrate P held on the second substrate stage 2 (or the first substrate stage 1) is started or the time of period from when exposure of the substrate P held on the first substrate stage 1 (or the second substrate stage 2) is completed to when measurement using the measurement region 2S (or the measurement region 1S) on the second substrate stage 2 (or the first substrate stage 1) is started can be reduced. Therefore, the throughput of the exposure apparatus EX can be increased.

Figure 15:
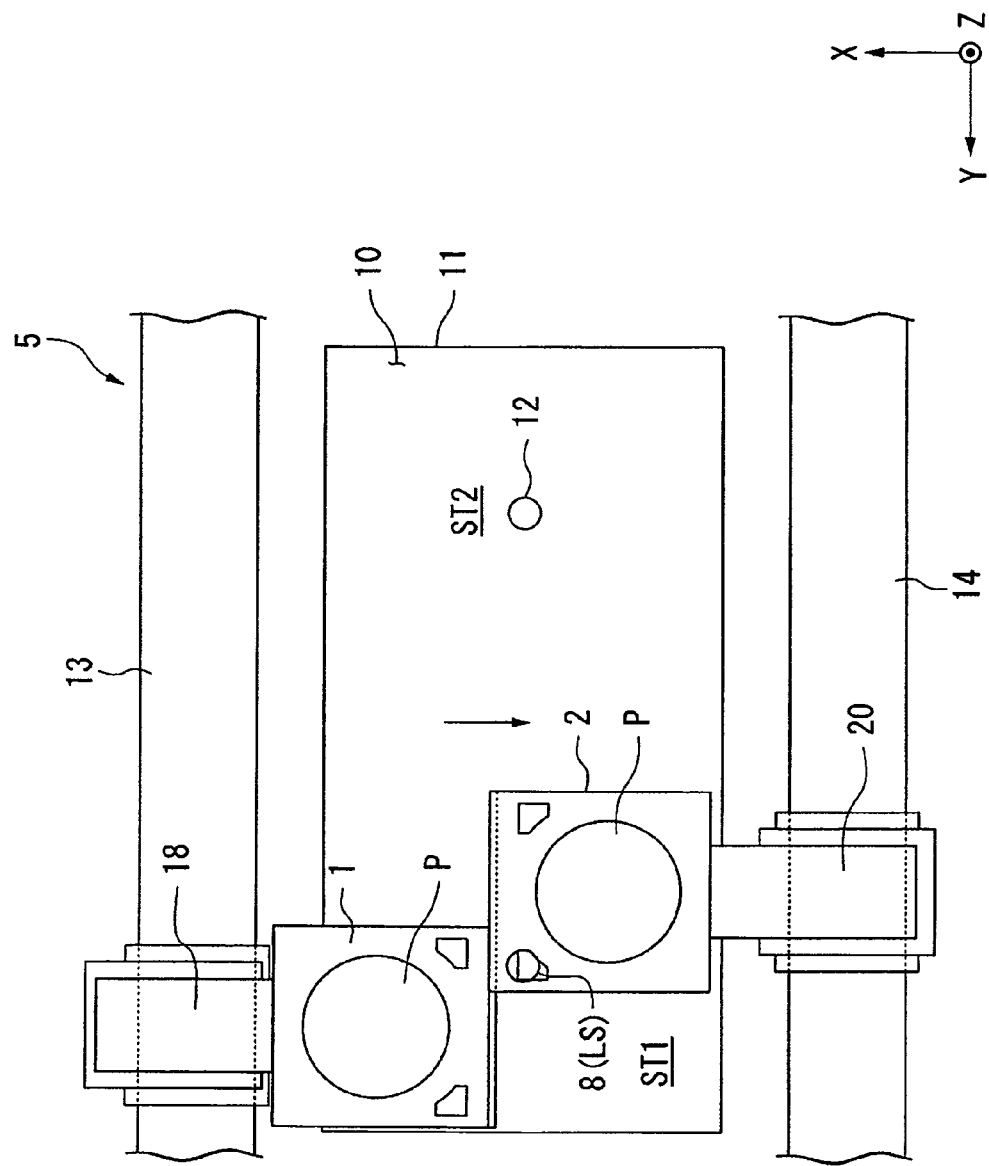
FIG. 15 is a schematic diagram for illustrating an exposure method according to the first embodiment.
Figure 16:
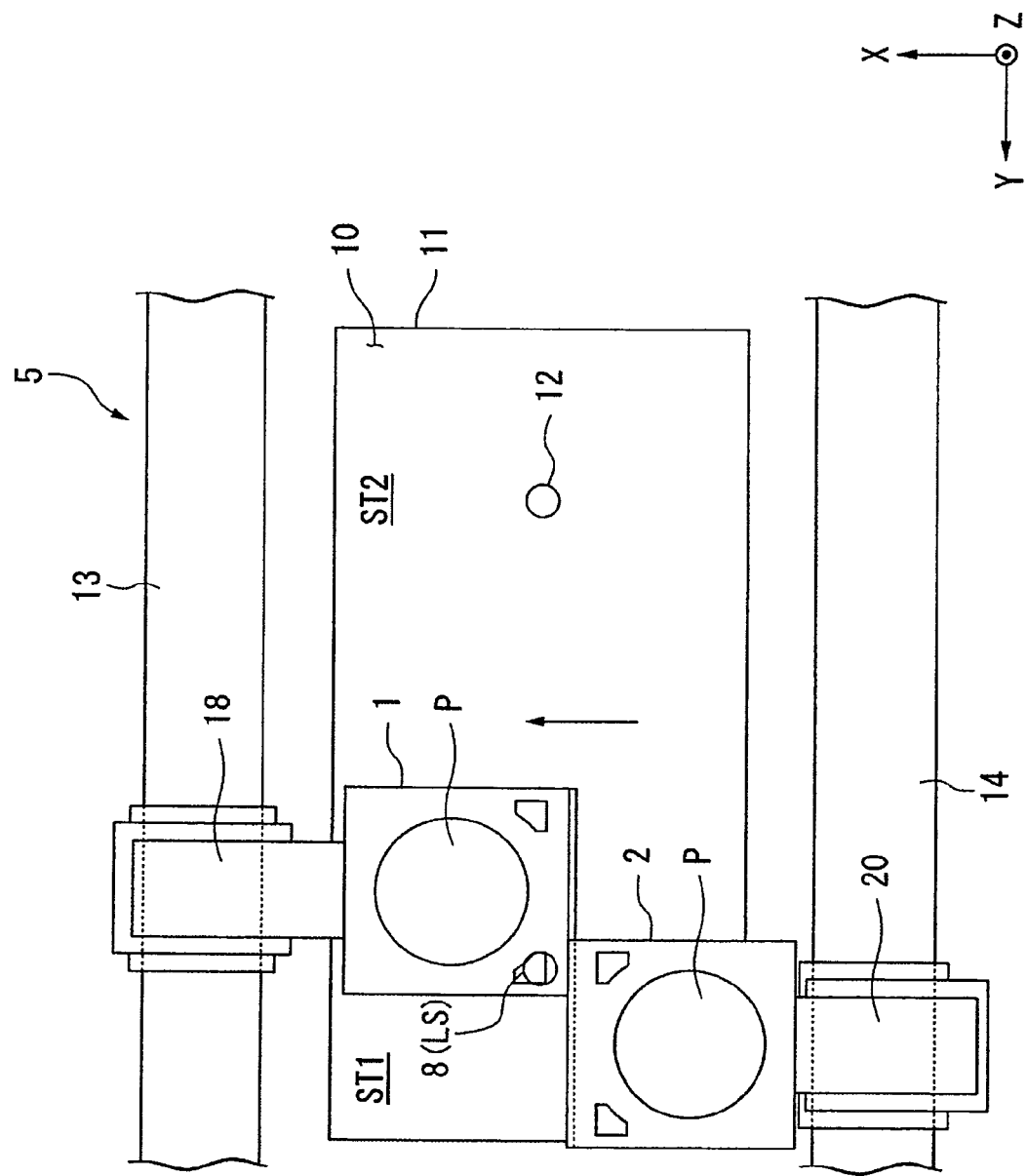
FIG. 16 is a schematic diagram for illustrating an exposure method according to the first embodiment.

In this embodiment, after the exposure of the substrate P held on the first substrate stage 1 (or the second substrate stage 2) is completed and before exposure of the substrate P held on the second substrate stage 2 (or the first substrate stage 1) is started, when the substrate-stage driving system 5 performs synchronous movement while the first substrate stage 1 is close to or in contact with the second substrate stage 2, the substrate-stage driving system 5 performs this synchronous movement while the first substrate stage 1 is close to or in contact with the second substrate stage 2 and the first substrate stage 1 (or the second substrate stage 2) is set at a position closer to the second optical element 12 (the measurement station ST2) than the second substrate stage 2 (or the first substrate stage 1). However, after the exposure of the substrate P held on the first substrate stage 1 (or the second substrate stage 2) is completed and before exposure of the substrate P held on the second substrate stage 2 (or the first substrate stage 1) is started, when the substrate-stage driving system 5 performs synchronous movement while the first substrate stage 1 is close to or in contact with the second substrate stage 2, the substrate-stage driving system 5 may perform this synchronous movement while the first substrate stage 1 is close to or in contact with the second substrate stage 2 and the first substrate stage 1 (or the second substrate stage 2) is set at a position farther away from the second optical element 12 (the measurement station ST2) than the second substrate stage 2 (or the first substrate stage 1) according to, for example, the exposure sequence, as shown in FIG. 15 and FIG. 16. FIG. 15 shows a state resulting from the process of setting the first substrate stage 1 holding the exposed substrate P at a position farther away from the second optical element 12 (the measurement station ST2) than the second substrate stage 2 holding the non-exposed substrate P and changing from the state where the first optical element 8 opposes the first substrate stage 1 to the state where the first optical element 8 opposes the second substrate stage 2 by synchronously moving the first substrate stage 1 and the second substrate stage 2 in the X axial direction while the first substrate stage 1 is close to or in contact with the second substrate stage 2. FIG. 16 shows a state resulting from the process of setting the second substrate stage 2 holding the exposed substrate P at a position farther away from the second optical element 12 (the measurement station ST2) than the first substrate stage 1 holding the non-exposed substrate P and changing from the state where the first optical element 8 opposes the second substrate stage 2 to the state where the first optical element 8 opposes the first substrate stage 1 by synchronously moving the first substrate stage 1 and the second substrate stage 2 in the X axial direction while the first substrate stage 1 is close to or in contact with the second substrate stage 2. In this manner, according to, for example, the exposure sequence, the first substrate stage 1 and the second substrate stage 2 can be synchronously moved in the X axial direction by appropriately adjusting the positional relationship between the first substrate stage 1 and the second substrate stage 2 in the Y axial direction.

In this embodiment, the first substrate stage 1 and the second substrate stage 2 are synchronously moved such that the −X-side end-face of the first substrate stage 1 is close to or in contact with the +X-side end-face of the second substrate stage 2. However, the state where the first substrate stage 1 opposes the first optical element 8 (the liquid LQ is held between the first substrate stage 1 and the first optical element 8) can be switched to a state where the second substrate stage 2 opposes the first optical element 8 (the liquid LQ is held between the second substrate stage 2 and the first optical element 8) also by synchronously moving the first substrate stage 1 and the second substrate stage 2 in the X axial direction while the +Y-side (or −Y-side) end-face of the first substrate stage 1 is close to or in contact with the −Y-side (or +Y-side) end-face of the second substrate stage 2. Similarly, the state where the second substrate stage 2 opposes the first optical element 8 (or the liquid LQ is held between the second substrate stage 2 and the first optical element 8) can be switched to a state where the first substrate stage 1 opposes the first optical element 8 (the liquid LQ is held between the first substrate stage 1 and the first optical element 8).

<Second Embodiment>

Figure 17:
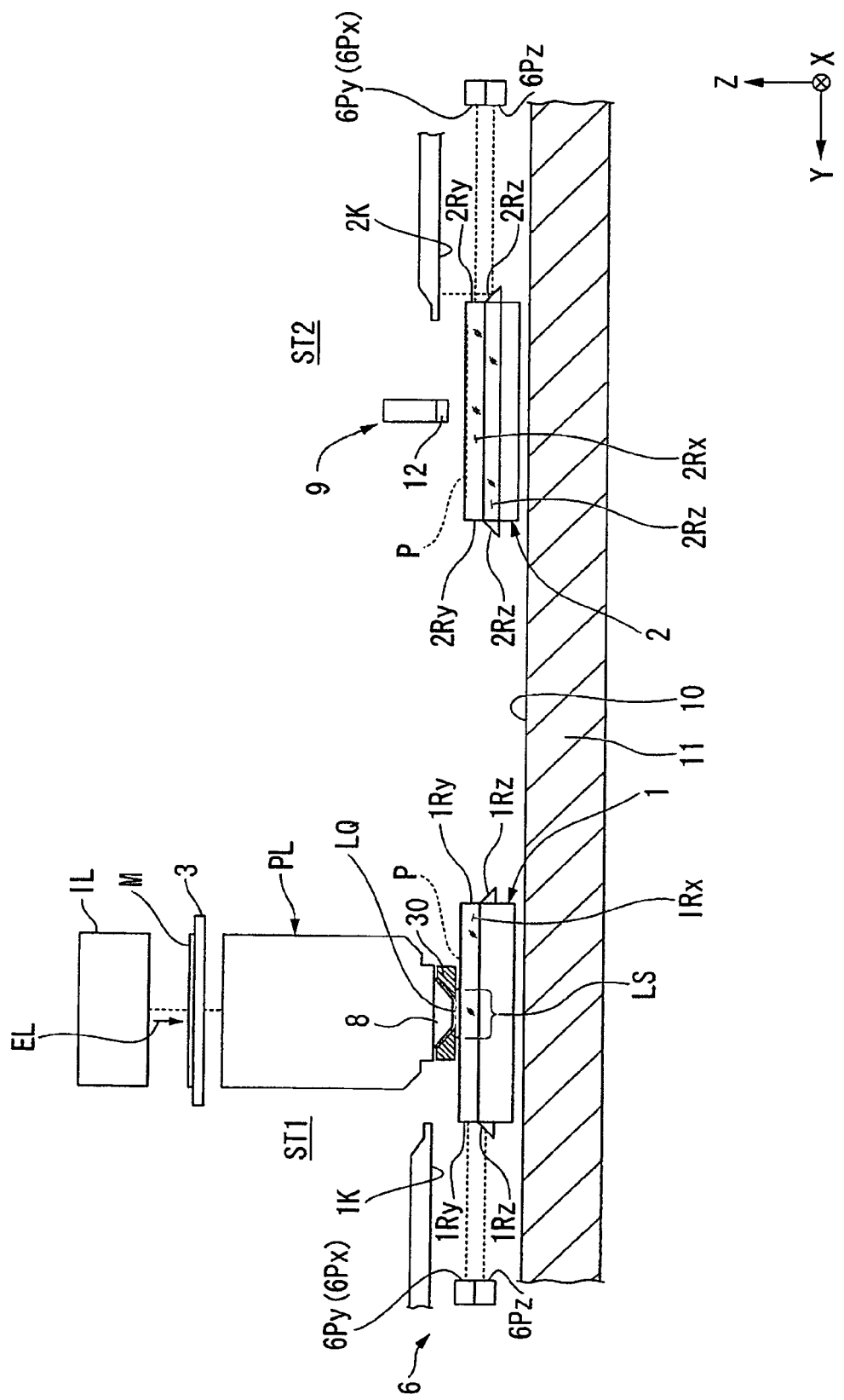
FIG. 17 is a schematic diagram showing an exposure apparatus according to a second embodiment.
Figure 18:
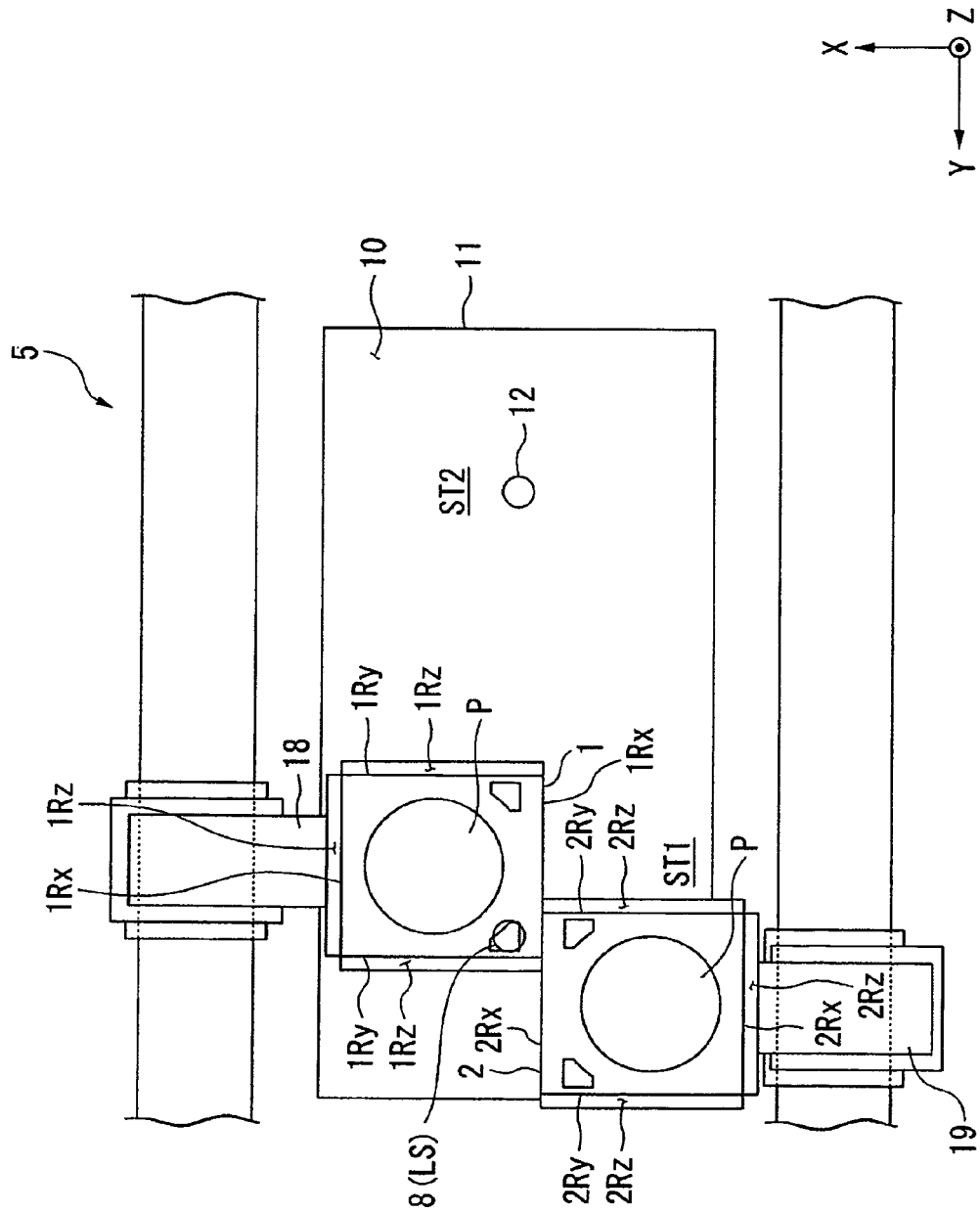
FIG. 18 is a schematic diagram for illustrating an exposure method according to the second embodiment.

Next, a second embodiment will be described. FIG. 17 is a schematic diagram showing the exposure apparatus EX according to a second embodiment. FIG. 18 is a plan view of the first and second substrate stages 1 and 2 and the substrate-stage driving system 5 according to the second embodiment. This embodiment is characterized in that the first substrate stage 1 has four end faces around a substrate P held by the first substrate stage 1 and measuring mirrors, provided on three of the four end faces, which are illuminated with measuring light for position measurement and in that the second substrate stage 2 has four end faces around a substrate P held by the second substrate stage 2 and measuring mirrors, provided on three of the four end faces, which are illuminated with measuring light for position measurement. This embodiment is also characterized in that the substrate-stage driving system 5 performs movement while part of the end face, on which no measuring mirror is provided, of the first substrate stage 1 is close to or in contact with part of the end face, on which no measuring mirror is provided, of the second substrate stage 2. In the following description, components that are the same as or equivalent to those described in the foregoing first embodiment are denoted by the same reference numerals, and thus a description thereof will be given only briefly or omitted.

Referring to FIG. 17 and FIG. 18, the first substrate stage 1 and the second substrate stage 2 include measuring mirrors 1Rx, 1Ry, 1Rz, 2Rx, 2Ry, and 2Rz which are illuminated with measuring light from the measurement system 6 for measuring the positions of the first substrate stage 1 and the second substrate stage 2.

As in the above-described first embodiment, the first and second substrate stages 1 and 2 of this embodiment are substantially rectangular in the XY plane. The first substrate stage 1 has four end faces around the substrate P held by the first substrate stage 1. The second substrate stage 2 has four end faces around the substrate P held by the second substrate stage 2.

The measuring mirror 1Rx is provided on the +X-side surface (end face) and the −X-side surface (end face) of the first substrate stage 1. The measuring mirrors 1Rx are substantially parallel to the YZ plane. The measuring mirror 1Ry is provided on the +Y-side surface (end face) and the −Y-side surface (end face) of the first substrate stage 1. The measuring mirrors 1Ry are substantially parallel to the XZ plane. The measuring mirror 1Rz is provided on three of the four end faces of the first substrate stage 1. In this embodiment, the measuring mirror 1Rz is disposed on the +X-side, +Y-side, and −Y-side end faces of the first substrate stage 1. The reflecting surfaces of the measuring mirrors 1Rz are tilted to face upward by a predetermined angle (e.g., 45 degree). Furthermore, the measuring mirrors 1Rz project outward from the measuring mirrors 1Rx and 1Ry disposed on side surfaces (end faces) of the first substrate stage 1.

The measuring mirror 2Rx is provided on the +X-side surface (end face) and the −X-side surface (end face) of the second substrate stage 2. The measuring mirrors 2Rx are substantially parallel to the YZ plane. The measuring mirror 2Ry is provided on the +Y-side surface (end face) and the −Y-side surface (end face) of the second substrate stage 2. The measuring mirrors 2Ry are substantially parallel to the XZ plane. The measuring mirror 2Rz is provided on three of the four end faces of the second substrate stage 2. In this embodiment, the measuring mirror 2Rz is provided on the −X-side, +Y-side, and −Y-side end faces of the second substrate stage 2. The reflecting surfaces of the measuring mirrors 2Rz are tilted to face upward by a predetermined angle (e.g., 45-degree). Furthermore, the measuring mirrors 2Rz project outward from the measuring mirrors 2Rx and 2Ry disposed on side surfaces (end face) of the second substrate stage 2.

The measurement system 6 of this embodiment includes an X interferometer 6Px, a Y interferometer 6Py, and a Z interferometer 6Pz which can illuminate the measuring mirrors 1Rx, 1Ry, 1Rz, 2Rx, 2Ry, and 2Rz provided at predetermined positions of the first and second substrate stages 1 and 2 with measuring light for position measurement to measure positional information of the first and second substrate stages 1 and 2. Each of the measuring mirrors 1Rx, 1Ry, 1Rz, 2Rx, 2Ry, and 2Rz is illuminated by the X, Y, and Z interferometers 6Px, 6Py, and 6Pz with measuring light for position measurement.

A plurality of each of the X, Y, and Z interferometers 6Px, 6Py, and 6Pz is provided. The X, Y, and Z interferometers 6Px, 6Py, and 6Pz are provided in each of the exposure station ST1 and the measurement station ST2. The X, Y, and Z interferometers 6Px, 6Py, and 6Pz provided in the exposure station ST1 measure positional information of the first substrate stage 1 (or the second substrate stage 2) existing in the exposure station ST1. The X, Y, and Z interferometers 6Px, 6Py, and 6Pz provided in the measurement station ST2 measure positional information of the second substrate stage 2 (or the first substrate stage 1 existing in the measurement station ST2.

The X interferometers 6Px can emit measuring light with a measuring axis along the X axial direction onto the measuring mirrors 1Rx and 2Rx to measure positions of the first and second substrate stages 1 and 2 with respect to the X axial direction. The Y interferometers 6Py can emit measuring light with a measuring axis along the Y axial direction onto the measuring mirrors 1Ry and 2Ry to measure positions of the first and second substrate stages 1 and 2 with respect to the Y axial direction. The Z interferometers 6Pz can emit measuring light with a measuring axis along the Z axial direction onto the measuring mirrors 1Rz and 2Rz to measure positions of the first and second substrate stages 1 and 2 with respect to the Z axial direction.

The reflecting surfaces of the measuring mirrors 1Rz and 2Rz are tilted to face upward by a predetermined angle (e.g., 45 degree). Measuring light that is emitted from a Z interferometer 6Pz onto the measuring mirrors 1Rz and 2Rz is reflected at the reflecting surfaces of the measuring mirrors 1Rz and 2Rz and is incident upon measuring mirrors 1K and 2K supported by predetermined support members. Thereafter, the measuring light reflected at the measuring mirrors 1K and 2K is received by the Z interferometer 6Pz via the measuring mirrors 1Rz and 2Rz of the first and second substrate stages 1 and 2. Using the received measuring light, the Z interferometer 6Pz can measure positional information of the first and second substrate stages 1 and 2 in the Z axial direction.

Techniques related to the Z interferometers which can measure positional information of the first and second substrate stages 1 and 2 in the Z axial direction are described in, for example, Japanese Patent Application Publication No. 2000-323404 and Published Japanese Translation No. 2001-513267 of the PCT International Publication.

Next, one example of the operation of the exposure apparatus EX according to the second embodiment will be described.

As in the above-described first embodiment, in the measurement station ST2, the control apparatus 7 starts exchange operation of the substrate P, including, for example, unloading and loading the substrate P from and onto the second substrate stage 2, and measurement processing related to the second substrate stage 2 holding the loaded substrate P. On the other hand, the first substrate stage 1 holding the substrate P which has already been loaded is disposed in the exposure station ST1. Thus, exposure of the substrate P that has been subjected to measurement processing in the measurement station ST2 is started.

In the exposure station ST1, the control apparatus 7 moves the first substrate stage 1 using the substrate-stage driving system 5 to carry out exposure processing of the substrate P held on the first substrate stage 1. Furthermore, in the measurement station ST2, the control apparatus 7 moves the second substrate stage 2 using the substrate-stage driving system 5 to carry out measurement processing of the substrate P held on the second substrate stage 2 in parallel with at least part of the exposure processing of the substrate P held on the first substrate stage 1.

Measurement operations in the measurement station ST2 include a detection operation using the above-described alignment system 9 and a detection operation using the focus leveling detection system. For example, for a detection operation using the focus leveling detection system, the control apparatus 7 detects surface-position information about a predetermined reference surface and the surface of the substrate P using the focus leveling detection system in the measurement station ST2, while measuring positional information about the second substrate stage 2 in the Z axial direction using the Z interferometer 6Pz. Using the Z interferometer 6Pz, the measurement system 6 emits measuring light onto the measuring mirror 2Rz disposed on each of the three end faces (−X-side, +Y-side, and −Y-side end faces) of the four end faces of the second substrate stage 2 to measure positional information of the second substrate stage 2 in the Z axial direction.

After exposure processing of the substrate P held on the first substrate stage 1 is completed in the exposure station ST1 and measurement processing of the substrate P held on the second substrate stage 2 is completed in the measurement station ST2, the control apparatus 7 starts to move the second substrate stage 2 from the measurement station ST2 to the exposure station ST1. When the second substrate stage 2 moves to the exposure station ST1, both the first substrate stage 1 and the second substrate stage 2 are positioned in the exposure station ST1.

Next, in order to subject the substrate P on the second substrate stage 2 to immersion exposure, the control apparatus 7 changes the state where the first substrate stage 1 opposes the first optical element 8 (the liquid LQ is held between the first substrate stage 1 and the first optical element 8) to a state where the second substrate stage 2 opposes the first optical element 8 (the liquid LQ is held between the second substrate stage 2 and the first optical element 8).

In this embodiment, when the upper surface 1T of the first substrate stage 1 is to be brought close to or in contact with the upper surface 2T of the second substrate stage 2 in order to change the state where the liquid LQ is held between the first substrate stage 1 and the first optical element 8 to a state where the liquid LQ is held between the second substrate stage 2 and the first optical element 8, the control apparatus 7, as shown in FIG. 18, synchronously moves the first substrate stage 1 and the second substrate stage 2 in the −X direction in a predetermined area of the guide surface 10 including the first position, which opposes the first optical element 8, while the −X-side end-face (the first opposing surface 1J), on which no measuring mirror 1Rz is provided, of the first substrate stage 1 is close to or in contact with the +X-side end-face (the second opposing surface 2J), on which no measuring mirror 2Rz is provided, of the second substrate stage 2. Furthermore, as in the above-described first embodiment, the control apparatus 7 uses the substrate-stage driving system 5 to move the first substrate stage 1 and the second substrate stage 2 in the X axial direction of the guide surface 10 including the first position, which opposes the first optical element 8, while the first opposing surface 1J of the first substrate stage 1 is close to or in contact with the second opposing surface 2J of the second substrate stage 2 in a state where the positions of the first substrate stage 1 and the second substrate stage 2 with respect to the Y axial direction are shifted.

By bringing the end faces (the first and second opposing surfaces 1J and 2J), on which the measuring mirrors 1Rz and 2Rz are not provided, of the first substrate stage 1 and the second substrate stage 2 close to or into contact with each other, the upper surface 1T of the first substrate stage 1 can be brought close to or into contact with the upper surface 2T of the second substrate stage 2 satisfactorily. By doing so, while maintaining the immersion space LS of the liquid LQ and preventing the liquid LQ from leaking, the state where the liquid LQ is held between the first substrate stage 1 and the first optical element 8 can be smoothly changed to a state where the liquid LQ is held between the second substrate stage 2 and the first optical element 8. In short, the state where the first substrate stage 1 opposes the first optical element 8 can be changed to a state where the second substrate stage 2 opposes the first optical element 8 while keeping the optical path space of the exposure light EL on the light-exit side of the first optical element 8 being filled with the liquid LQ.

Thereafter, the control apparatus 7 controls the substrate-stage driving system 5 to move the first substrate stage 1 to the measurement station ST2 while keeping the second substrate stage 2 being opposed to the first optical element 8. Then, after the second substrate stage 2 is positioned in the exposure station ST1 and the first substrate stage 1 is positioned in the measurement station ST2, the control apparatus 7 starts, for example, substrate exchange operation including unloading and loading the substrate P with the first substrate stage 1 and measurement processing of the substrate P that has been loaded onto the first substrate stage 1. In addition, in the exposure station ST1, the control apparatus 7 carries out immersion exposure of the substrate P held on the second substrate stage 2. Subsequently, the above-described operation is repeated.

In addition, in this embodiment, also when the upper surface 1T of the first substrate stage 1 is to be brought close to or in contact with the upper surface 2T of the second substrate stage 2 in order to change the state where the liquid LQ is held between the second substrate stage 2 and the first optical element 8 to a state where the liquid LQ is held between the first substrate stage 1 and the first optical element 8, the control apparatus 7 synchronously moves the first substrate stage 1 and the second substrate stage 2 in the +X direction in a predetermined area of the guide surface 10 including the first position, which opposes the first optical element 8, while the −X-side end-face (the first opposing surface 1J), on which no measuring mirror 1Rz is provided, of the first substrate stage 1 is close to or in contact with the +X-side end-face (the second opposing surface 2J), on which no measuring mirror 2Rz is provided, of the second substrate stage 2. By doing so, while maintaining the immersion space LS of the liquid LQ and preventing the liquid LQ from leaking, the state where the liquid LQ is held between the first substrate stage 1 and the first optical element 8 can be smoothly changed to a state where the liquid LQ is held between the second substrate stage 2 and the first optical element 8.

The structures of the first and second substrate stages 1 and 2 and the structure of the substrate-stage driving system 5 are not limited to those described in this embodiment. Although this embodiment is constructed such that each of the substrate stages 1 and 2 is driven via a member that is driven in the X axial direction from one end of the guide surface 10, each of the substrate stages 1 and 2 may be driven via a beam-shaped member connecting both ends of the guide surface, as described in, for example, Japanese Patent Application Publication No. 2000-323404.

Although the optical path space adjacent to the image plane side (exit surface) of the front-end optical element is filled with liquid in the projection optical system according to each of the above-described embodiments, a projection optical system where the optical path space adjacent to the object plane (incident surface) of the front-end optical element is filled with liquid, as described in PCT International Publication No. WO 2004/019128, may also be employed.

Note that the liquid LQ of this embodiment is water, but it may be a liquid other than water. For example, if the light source of the exposure light EL is an F2 laser, this F2 laser light will not pass through water, so the liquid LQ may be, for example, a fluorocarbon fluid such as a perfluoropolyether (PFPE) or a fluorocarbon oil that an F2 laser is able to pass through. In addition, it is also possible to use, as the liquid LQ, liquids that have transmittance with respect to the exposure light EL and whose refractive index is as high as possible and that are stable with respect to the photoresist coated on the projection optical system PL and the surface of the substrate P (for example, cedar oil).

Moreover, as the liquid LQ, a liquid with a refractive index of about 1.6 to 1.8 may be used. The optical element (e.g., the terminal optical element FL) of the projection optical system PL, which is in contact with the liquid LQ, may be formed from quartz (silica) or a single crystal material of a fluoride compound such as calcium fluoride (fluorite), barium fluoride, strontium fluoride, lithium fluoride, and sodium fluoride. Furthermore, the terminal optical element FL may be formed from a material with a refractive index that is higher than that of quartz or fluorite (for example 1.6 or more). As materials with a refractive index that is 1.6 or more, it is possible to use sapphire and germanium dioxide, etc., disclosed in PCT International Patent Publication No. WO 2005/059617, and potassium chloride (refractive index of approximately 1.75) disclosed in PCT International Patent Publication No. WO 2005/059618. Moreover, a thin film that has lyophilicity and/or a dissolution prevention mechanism may be formed on a portion of the surface of the terminal optical element (including at least the contact surface with the liquid) or all thereof. Note that silica has a high affinity with liquid, and a dissolution prevention mechanism is not required, but it is preferable to at least form a dissolution prevention film in the case of fluorite. For the liquid LQ, various liquids, for example a supercritical liquid, can be used. Here, a liquid with a refractive index that is higher than that of pure water (for example, 1.5 or higher) includes for example a predetermined liquid with a C—H bond and an O—H bond such as isopropanol with a refractive index of approximately 1.5 and glycerol (glycerine) with a refractive index of approximately 1.61; a predetermined liquid (organic solvent) such as hexane, heptane, decane; and Decalin (Decahydronaphthalene) with a refractive index of approximately 1.60. Alternatively, the liquid can be one that is a mixture of two or more types of optional liquids among these predetermined liquids, or one that is made by adding (mixing) at least one of these liquids to/with pure water. Alternatively, as the liquid, one in which an acid or a base such as $H^+$, $Cs^+$, and $K^+$, or $Cl^-$, $SO_4^{2-}$, and $PO_4^{2-}$ is added to (mixed with) pure water can be used, and a liquid in which fine particles of for example Al oxide are added to (mixed with) pure water can be used. Furthermore, the liquid is preferably one for which the light absorption coefficient is small, the temperature dependency is small, and which is stable with respect to the photosensitive material (or top coat film or anti-reflection film, etc.) painted on the surface of the projection optical system and/or the substrate. Furthermore, a top coat film and the like that protects the photosensitive material and substrate from the liquid can be provided on the substrate.

In the above-mentioned embodiments, position information for the mask stage and the substrate stage is measured using an interference system. However the invention is not limited to this and for example, an encoder system which detects a scale (grating) provided in each stage may be used. In this case, preferably a hybrid system is furnished with both of an interference system and an encoder system, and calibration of the measurement results of the encoder system is performed using the measurement results of the interference system. Moreover, position control of the stages may be performed using the interference system and the encoder system interchangeably, or using both.

It is to be noted that as for the substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), or a film member etc. used in the exposure apparatus can be used. Furthermore, the shape of the substrate is not limited to a circle, and may be another shape such as a rectangle.

As for the exposure apparatus EX, in addition to a step-and-scan-type scanning exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Furthermore, after a reduced image of a first pattern is transferred onto the substrate P using the projection optical system during step-and-repeat type exposure while the first pattern and the substrate P are in a substantially stationary state, a reduced image of a second pattern may be exposed in a batch on the substrate P, partially overlapping the first pattern, by using the projection optical system, while the second pattern and the substrate P are in a substantially stationary state (stitch-type batch exposure apparatus). Furthermore, as the stitch type exposure apparatus, a step-and-stitch type exposure apparatus in which at least two patterns are transferred onto the substrate P in a partially overlapping manner, and the substrate P is sequentially moved can be used.

Moreover, the present invention can also be applied to an exposure apparatus furnished with a substrate stage for holding a substrate and a measurement stage on which is mounted a reference member formed with a reference mark, and/or various photoelectronic sensors, as disclosed for example in Japanese Patent Application Publication No. H11-135400 and Japanese Patent Application Publication No. 2000-164504 (corresponding to U.S. Pat. No. 6,897,963). Also when the immersion space LS is to be moved between the substrate stage and the measurement stage, the throughput of the exposure apparatus EX can be increased while holding the liquid LQ satisfactorily by synchronous movement in a direction intersecting a predetermined direction while the substrate stage is close to or in contact with the measurement stage such that the positions of the substrate stage and the measurement stage in a predetermined direction are shifted according to, for example, the exposure sequence.

Moreover, in the above-described embodiments, an exposure apparatus furnished with the projection optical system PL was described as an example; however the present invention can also be applied to an exposure apparatus and an exposure method which does not use the projection optical system PL. Even in the case where the projection optical system PL is not used in this manner, the exposure light can be shone onto the substrate via optical members such as a lens, and an immersion space is formed in a predetermined space between these optical elements and the substrate.

Although the above-described embodiments have been described by way of example of a liquid immersion method where the substrate P is exposed while the optical path space of the exposure light EL is filled with the liquid LQ, the present invention can also be applied to a normal dry exposure apparatus where the optical path space of the exposure light EL is filled with not the liquid LQ but gas only. Also in a dry exposure apparatus, the throughput of the exposure apparatus EX can be increased by synchronously moving two stages in a direction intersecting a predetermined direction while the two stages are close to or in contact with each other such that the positions of the two stages in a predetermined direction are shifted according to, for example, the exposure sequence.

The type of the exposure apparatus EX is not limited to semiconductor device fabrication exposure apparatuses that expose the pattern of a semiconductor device on the substrate P, but can also be widely adapted to, for example, exposure apparatuses for fabricating liquid crystal display devices or displays, or exposure apparatuses for fabricating thin film magnetic heads, imaging devices (CCDs), micromachine, MEMS, DNA chip, or reticles and masks.

In the above-mentioned embodiments, an optical transmission type mask formed with a predetermined shielding pattern (or phase pattern or dimming pattern) on an optical transmission substrate is used. However instead of this mask, for example as disclosed in U.S. Pat. No. 6,778,257, an electronic mask (called a variable form mask; for example this includes a DMD (Digital Micro-mirror Device) as one type of non-radiative type image display element (also called a spatial light modulator (SLM))) for forming a transmission pattern or reflection pattern, or a light emitting pattern, based on electronic data of a pattern to be exposed may be used. An exposure apparatus that uses a DMD is disclosed for example in U.S. Pat. No. 6,778,257.

Furthermore the present invention can also be applied to an exposure apparatus (lithography system) which exposes a line-and-space pattern on the substrate P by forming interference fringes on the substrate P, as disclosed for example in PCT International PCT International Publication No. WO 2001/035168.

Moreover, the present invention can also be applied to, for example, an exposure apparatus as disclosed, for example, in Published Japanese Translation No. 2004-519850 (corresponding U.S. Pat. No. 6,611,316), which combines patterns of two masks on a substrate via a projection optical system, and double-exposes a single shot region on the substrate at substantially the same time, using a single scan exposure operation. Furthermore, the present invention can also be applied to an exposure apparatus of a proximity method, a mirror projection aligner, and so forth.

As far as is permitted, the disclosures in all of the Japanese Patent Publications and U.S. Patents related to exposure apparatuses and the like cited in the above respective embodiments and modified examples, are incorporated herein by reference.

As described above, the exposure apparatus EX according to the embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mechanical interconnection, the wiring and interconnection of electrical circuits, and the piping and interconnection of the atmospheric pressure circuit of the various subsystems. Obviously, before the process of assembly from these various subsystems to the exposure apparatus, there are processes of individual assembly of the respective subsystems. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 19:
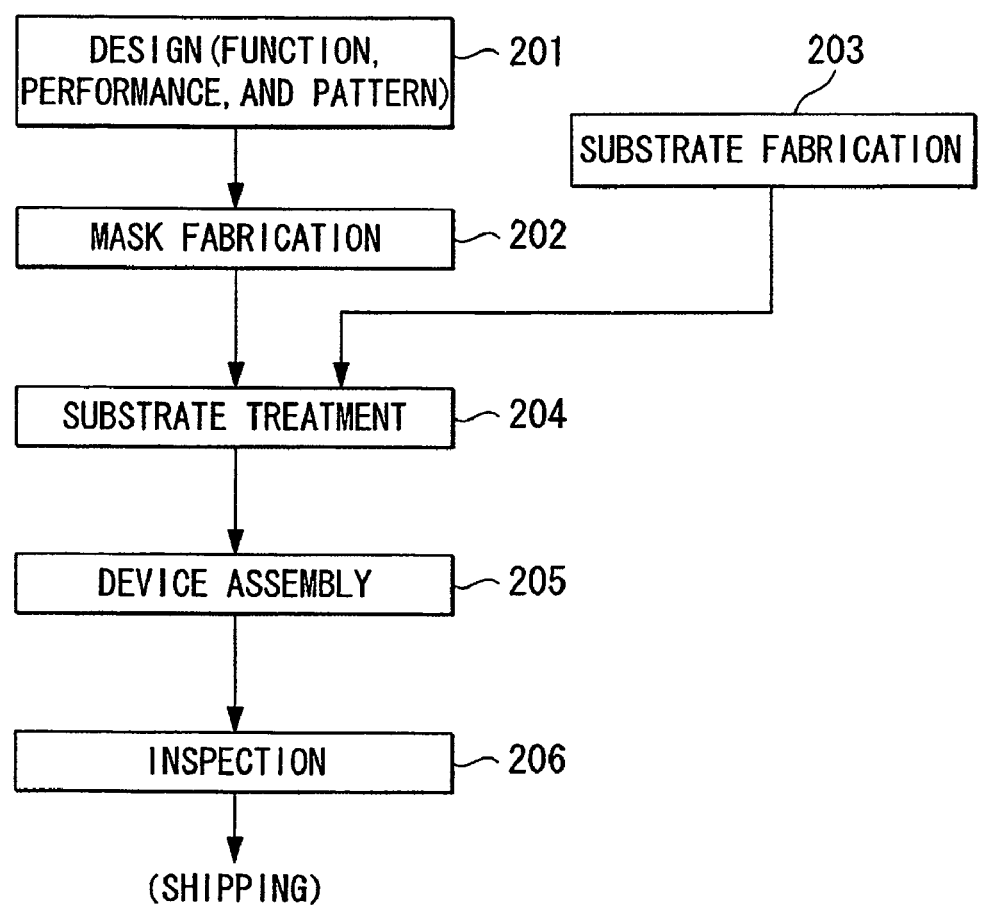
FIG. 19 is a flowchart illustrating one example of a microdevice manufacturing process.

As shown in FIG. 19, a micro-device, such as a semiconductor device, is manufactured by, for example: a step 201 that designs the functions and performance of the micro-device; a step 202 that fabricates a mask (reticle) based on this design step; a step 203 that fabricates a substrate, which is the base material of the device; a substrate-treatment step 204 that includes the substrate treatment (exposure process) of exposing the pattern of the mask onto the substrate according to the embodiments discussed above and developing the exposed substrate; a device assembling step 205 (comprising fabrication processes, such as a dicing process, a bonding process, and a packaging process); and an inspecting step 206.

What is claimed is:

1. An exposure apparatus that exposes a substrate with an exposure beam, the exposure apparatus comprising:
 a first optical member from which the exposure beam is emitted;
 a first object movable at a light-exit side of the first optical member;
 a second object movable, independently of the first object, at the light-exit side of the first optical member; and
 a driving unit that moves the first object and the second object in a first direction within a predetermined plane including a first position opposing the first optical member in a state in which the first object and the second object are close to or in contact with each other and the first object and the second object are offset from each other in a second direction within the predetermined plane.

2. The exposure apparatus according to claim 1, wherein the first object and the second object have a substantially same shape and size as each other.

3. The exposure apparatus according to claim 2, wherein each of the first object and the second object can move while holding a substrate.

4. The exposure apparatus according to claim 3, wherein the driving unit makes the first object and the second object close to or in contact with each other such that a liquid is held between the first optical member and at least one of the first object and the second object.

5. The exposure apparatus according to claim 4, comprising:
a device that has a second optical member and acquires positional information of a substrate held on at least one of the first object and the second object, wherein
each of the first object and the second object can move to a second position opposing the second optical member,
an operation of setting the first object at the first position and exposing a substrate held on the first object is performed in parallel with at least part of an operation of setting the second object at the second position and acquiring positional information of a substrate held on the second object, and
the driving unit moves the first object and the second object while the first object and the second object are close to or in contact with each other after exposure of the substrate held on the first object and before exposure of the substrate held on the second object.

6. The exposure apparatus according to claim 5, wherein, when the first object and the second object are moved while the first object and the second object are close to or in contact with each other after exposure of the substrate held on the first object and before exposure of the substrate held on the second object, the driving unit offsets the first object and the second object with respect to each other in the second direction such that the first object is set at a position closer to the second optical member than the second object.

7. The exposure apparatus according to claim 5, wherein the first object has four end faces around the substrate held on the first object,
the second object has four end faces around the substrate held on the second object,
a plurality of shot regions is set on each substrate and the plurality of shot regions is sequentially exposed, and
the driving unit, when the first object and the second object are moved while the first object and the second object are close to or in contact with each other after exposure of the substrate held on the first object and before exposure of the substrate held on the second object, offsets the first object and the second object with respect to each other in the second direction such that part of an end face of the first object, the end face of the first object being close to the shot region most recently exposed on the substrate held on the first object, is close to or in contact with part of an end face of the second object, the end face of the second object being close to the shot region that is exposed first on the substrate held on the second object.

8. The exposure apparatus according to claim 5, wherein the first object has four end faces around the substrate held on the first object and has third optical members provided on three of the four end faces, the third optical members being illuminated with a first measuring beam for position measurement,
the second object has four end faces around the substrate held on the second object and has fourth optical members provided on three of the four end faces, the fourth optical members being illuminated with a second measuring beam for position measurement, and
the driving unit, when the first object and the second object are moved while the first object and the second object are close to or in contact with each other after exposure of the substrate held on the first object and before exposure of the substrate held on the second object, makes part of the end face of the first object without the third optical member and part of the end face of the second object without the fourth optical member close to or in contact with each other in the first direction.

9. The exposure apparatus according to claim 5, wherein each of the first object and the second object has a reflecting member which is illuminated with a measuring beam for position measurement, the reflecting member including a first reflecting surface including a component of a third direction substantially orthogonal to the predetermined plane, a second reflecting surface which includes the third direction component and is substantially symmetrical to the first reflecting surface, and a third reflecting surface substantially orthogonal to at least one of the first direction and the second direction; and an end face projecting outward beyond the reflecting member, and
the driving unit moves the first object and the second object while part of the end face of the first object, the end face projecting outward beyond the reflecting member, is close to or in contact with part of the end face of the second object, the end face projecting outward beyond the reflecting member.

10. The exposure apparatus according to claim 4, wherein a width of an overlapping portion of the first and second objects due to the offset between the first and second objects in the second direction while the first object and the second object are close to or in contact with each other has a minimum possible value to allow a liquid to be held with the first optical member.

11. The exposure apparatus according to claim 1, wherein the driving unit includes:
a first driving unit which has a first stator and a first mover operating in conjunction with the first stator and moves the first object in the predetermined direction within the predetermined plane;
a second driving unit which has a second stator and a second mover operating in conjunction with the second stator and moves the second object in the predetermined direction;
a first support member which is provided with the first stator and movably supports one end of the first object; and
a second support member which is provided with the second stator and movably supports one end of the second object and wherein
the first support member is separated from the second support member at a predetermined interval in a direction orthogonal to the predetermined direction.

12. The exposure apparatus according to claim 11, wherein the driving unit includes:
a third driving unit which has a third stator connected to the first mover and a third mover operating in conjunction with the third stator and moves the first object in a direction orthogonal to the predetermined direction; and
a fourth driving unit which includes a fourth stator connected to the second mover and a fourth mover operating in conjunction with the fourth stator and moves the second object in a direction orthogonal to the predetermined direction.

13. A device manufacturing method comprising: exposing a substrate by use of the exposure apparatus according to claim 1; and developing the exposed substrate.

14. An exposure method for exposing a substrate with an exposure beam, the method comprising:
bringing a first object and a second object, which are movable at a light-exit side of a first optical member from which the exposure beam is emitted, close to or in contact with each other in a first direction within a predetermined plane including a first position opposing the first optical member; and moving the first object and the second object in the first direction in a state in which the first object and the second object are close to or in contact with each other and in which the first object and the second object are offset from each other in a second direction within the predetermined plane.

15. The exposure method according to claim 14, wherein a liquid is held between the first optical member and at least one of the first object and the second object while the first object and the second object move in the first direction.

16. A device manufacturing method comprising:
exposing a substrate by use of the exposure method according to claim 14; and developing the exposed substrate.

* * * * *